(12) United States Patent
Han

(10) Patent No.: US 11,796,372 B2
(45) Date of Patent: Oct. 24, 2023

(54) APPARATUS FOR MANUFACTURING DISPLAY APPARATUS, METHOD OF MEASURING DROPLET, AND METHOD OF MANUFACTURING DISPLAY APPARATUS

(71) Applicant: Samsung Display Co., Ltd., Yongin-si (KR)

(72) Inventor: Jeongwon Han, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 406 days.

(21) Appl. No.: 16/994,001

(22) Filed: Aug. 14, 2020

(65) Prior Publication Data

US 2021/0255019 A1    Aug. 19, 2021

(30) Foreign Application Priority Data

Feb. 14, 2020    (KR) .................... 10-2020-0018570

(51) Int. Cl.
| | | |
|---|---|---|
| *G01F 22/00* | (2006.01) | |
| *G06T 7/62* | (2017.01) | |
| *G01B 11/30* | (2006.01) | |
| *G06T 7/00* | (2017.01) | |

(52) U.S. Cl.
CPC ............ *G01F 22/00* (2013.01); *G01B 11/303* (2013.01); *G06T 7/0004* (2013.01); *G06T 7/62* (2017.01); *G06T 2207/30121* (2013.01); *G06T 2207/30144* (2013.01)

(58) Field of Classification Search
CPC .. G01F 22/00; G06T 7/62; G06T 2207/30144
USPC .......................................................... 73/861
See application file for complete search history.

(56) References Cited

U.S. PATENT DOCUMENTS

| 8,080,192 | B2 | 12/2011 | Yang et al. | |
|---|---|---|---|---|
| 8,342,623 | B2 | 1/2013 | Hong et al. | |
| 2003/0080143 | A1* | 5/2003 | Kale ................... | G01F 25/0092 |
| | | | | 222/1 |
| 2018/0257099 | A1 | 9/2018 | Miyazaki et al. | |

(Continued)

FOREIGN PATENT DOCUMENTS

| JP | 2000-153603 | 6/2000 |
|---|---|---|
| KR | 10-2008-0061776 | 7/2008 |

(Continued)

OTHER PUBLICATIONS

"Chromatic Light", pp. 5-8, https://nanovea.com/chromatic-confocal/.

(Continued)

*Primary Examiner* — Jeffery A Williams
(74) *Attorney, Agent, or Firm* — KILE PARK REED & HOUTTEMAN PLLC

(57) ABSTRACT

An apparatus for manufacturing a display apparatus includes at least one test table on which a droplet is disposed, at least one profile measurement portion disposed adjacent to the at least one test table to measure a surface profile of the at least one test table and a surface profile of the droplet disposed on the at least one test table, and a controller electrically connected to the at least one profile measurement portion to measure a volume of the droplet from a difference between the surface profile of the at least one test table and the surface profile of the droplet disposed on the at least one test table.

16 Claims, 31 Drawing Sheets

(56) References Cited

U.S. PATENT DOCUMENTS

2019/0025047 A1 1/2019 Ohba
2020/0028126 A1 1/2020 Harjee et al.

FOREIGN PATENT DOCUMENTS

| KR | 10-2011-0065098 | 6/2011 |
| KR | 10-1073976 | 10/2011 |
| KR | 10-2012-0098007 | 9/2012 |
| KR | 10-2013-0060508 | 6/2013 |
| KR | 10-2016-0083420 | 7/2016 |
| KR | 10-1701904 | 2/2017 |
| KR | 10-2017-0051466 | 5/2017 |
| KR | 10-1818695 | 1/2018 |
| KR | 10-2018-0102489 | 9/2018 |
| KR | 10-2019-0000602 | 1/2019 |

OTHER PUBLICATIONS

"Confocal microscopy", Wikipedia, pp. 1-14, https://en.wikipedia.org/wiki/Confocal_microscopy.

"Interferometric microscopy", Wikipedia, p. 1, https://en.wikipedia.org/wiki/Interferometric_microscopy.

"Laser Interferometers", zygo, pp. 1-2, https://www.zygo.com/?/met/interferometers/&gclid=EAlalQobChMIyfOC_Yq44AIV0qqWch0xqwXUEAAYASAAEglWuvD_BwE.

Juha Saily, "Chromatic Line Confocal Sensor Technology in High-Speed 3D and Deep Depth of Focus 2D Imaging Applications", Microscopy and Microanalysis, 2018, pp. 1142-1143, vol. 24 (Suppl 1), Microscopy Society of America.

"White Light Interferometry", nanoScience Instruments, pp. 1-2, https://www.nanoscience.com/techniques/optical-profilometry/white-light-interferometry.

* cited by examiner

APPARATUS FOR MANUFACTURING DISPLAY APPARATUS, METHOD OF MEASURING DROPLET, AND METHOD OF MANUFACTURING DISPLAY APPARATUS

CROSS-REFERENCE TO RELATED APPLICATIONS

This application claims priority to and benefits of Korean Patent Application No. 10-2020-0018570 under 35 U.S.C. § 119, filed on Feb. 14, 2020, in the Korean Intellectual Property Office, the entire contents of which are incorporated herein by reference.

BACKGROUND

1. Technical Field

One or more embodiments relate to a method and apparatus, and, to an apparatus for manufacturing a display apparatus, a method of measuring a droplet, and a method of manufacturing a display apparatus.

2. Description of the Related Art

Mobility-based electronic devices are widely used. As a mobile electronic device, tablet personal computers (PCs) have been recently widely used in addition to small electronic devices such as mobile phones.

Such a mobile electronic device may generally include a display apparatus providing various functions, that is, visual information such as an image or video, to a user. Recently, the importance of display apparatuses in electronic devices has been increasing, and structures that may be bent to have a certain or predetermined angle while laid flat have also been developed.

A display apparatus may include various layers, and various processes may be used to form the various layers. In a case that an organic material is used in various layers of the display apparatus, an organic material may be stacked or a structure may be formed through a printing process. During the printing process, factors such as resolution of the display apparatus may be determined depending on how a pattern of organic material droplets is formed, and accordingly, it may be common to discharge organic material droplets to a test table in advance and then to a substrate.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a method of measuring a droplet whereby a volume of a droplet may be measured precisely by reflecting a surface profile of at least one test table.

One or more embodiments may include a method and apparatus for manufacturing a display apparatus whereby a droplet may be accurately discharged to or disposed on a substrate by reflecting a volume of the droplet accurately measured as above.

Additional aspects will be set forth in part in the description which follows and, in part, will be apparent from the description, or may be learned by practice of the presented embodiments of the disclosure.

According to one or more embodiments, an apparatus for manufacturing a display apparatus may include at least one test table on which a droplet may be disposed; at least one profile measurement portion disposed adjacent to the at least one test table to measure a surface profile of the at least one test table and a surface profile of the droplet disposed on the at least one test table; and a controller electrically connected to the at least one profile measurement portion to measure a volume of the droplet from a difference between the surface profile of the at least one test table and the surface profile of the droplet disposed on the at least one test table.

The at least one profile measurement portion may include a first profile measurement portion and a second profile measurement portion, the at least one test table may include a first test table and a second test table, the first profile measurement portion may measure a surface profile of the first test table, and the second profile measurement portion may measure a surface profile of the second test table.

The at least one profile measurement portion may include a first profile measurement portion and a second profile measurement portion, the first profile measurement portion may measure a surface profile of a first region of the at least one test table, and the second profile measurement portion may measure a surface profile of a second region of the at least one test table.

An apparatus for manufacturing a display apparatus may include at least one test table on which a droplet may be disposed; at least one profile measurement portion disposed adjacent to the at least one test table to measure a surface profile of the at least one test table; at least one size measurement portion that may measure a size of the droplet disposed on the at least one test table; and a controller electrically connected to the at least one profile measurement portion and the at least one size measurement portion, wherein the controller may measure the volume of the droplet from the surface profile of the at least one test table and the size of the droplet measured by the at least one size measurement portion.

The at least one profile measurement portion may include a first profile measurement portion and a second profile measurement portion, and the at least one size measurement portion may include a first size measurement portion and a second size measurement portion.

The at least one test table may include a first test table and a second test table, the first profile measurement portion and the first size measurement portion may measure a surface profile of the first test table and a size of a droplet disposed on the first test table, respectively, and the second profile measurement portion and the second size measurement portion may measure a surface profile of the second test table and a size of a droplet disposed on the second test table, respectively.

The first profile measurement portion and the first size measurement portion may measure a surface profile of a first region of the at least one test table and a size of a droplet disposed on the first region, respectively, and the second profile measurement portion and the second size measurement portion may measure a surface profile of a second region of the at least one test table and a size of a droplet disposed on the second region, respectively.

The at least one test table may include a film feeder that may feed a film on which the droplet may be disposed, and a film collector that may collect the film.

The apparatus may further include a droplet discharger that may discharge the droplet to the at least one test table.

According to one or more embodiments, a method of measuring a droplet may include measuring a surface profile of at least one test table, disposing a droplet on the at least one test table; measuring a surface profile of the droplet disposed on the at least one test table; and measuring a volume of the droplet from a difference between the surface profile of the at least one test table and the surface profile of the droplet disposed on the at least one test table.

The at least one test table may include a first test table and a second test table, and a surface profile of a droplet disposed on the second test table may be measured when measuring a surface profile of the first test table.

The at least one test table may include a first test table and a second test table, and a surface profile of the first test table and a surface profile of the second test table may be simultaneously measured.

The measuring of the surface profile may include measuring a surface profile of a first region of the at least one test table; and measuring a surface profile of a second region of the at least one test table.

A method of measuring a droplet may include measuring a surface profile of at least one test table; disposing a droplet on the at least one test table; measuring a size of the droplet disposed on the at least one test table; and measuring the volume of the disposed droplet from the surface profile of the at least one test table and the size of the droplet disposed on the at least one test table.

The at least one test table may include a first test table and a second test table, and a size of a droplet disposed on the second test table may be measured when measuring a surface profile of the first test table.

The at least one test table may include a first test table and a second test table, and a size of a droplet disposed on the first test table and a size of a droplet disposed on the second test table may be simultaneously measured.

The measuring of the volume of the droplet may further include measuring a surface profile of a first region of the at least one test table and a surface profile of a second region of the at least one test table; and measuring a size of a droplet disposed on the first region and a size of a droplet disposed on the second region.

The disposing of the droplet on the at least one test table may include discharging the droplet to a film of the at least one test table; and collecting the film.

According to one or more embodiments, a method of manufacturing a display apparatus may include measuring a surface profile of at least one test table; disposing a droplet on the at least one test table; measuring a surface profile of the liquid droplet disposed on the at least one test table; measuring a volume of the droplet from a difference between the surface profile of the at least one test table and the surface profile of the droplet disposed on the at least one test table; and discharging the droplet to a substrate in accordance with the measured volume of the droplet.

The at least one test table may include a first test table and a second test table, and a surface profile of a droplet disposed on the second test table may be measured when measuring a surface profile of the first test table.

The at least one test table may include a first test table and a second test table, and a surface profile of the first test table and a surface profile of the second test table may be simultaneously measured.

The measuring of the surface profile may include measuring a surface profile of a first region of the at least one test table; and measuring a surface profile of a second region of the at least one test table.

The measuring of the volume of the discharged droplet may include measuring a size of the droplet disposed on the at least one test table; and measuring the volume of the discharged droplet from the surface profile of the at least one test table and the size of the droplet disposed on the at least one test table.

A method of manufacturing a display apparatus may include measuring a surface profile of at least one test table; disposing a droplet on the at least one test table; measuring a size of the droplet disposed on the at least one test table; measuring the volume of the disposed droplet from the surface profile of the at least one test table and the size of the droplet disposed on the at least one test table; and discharging the droplet to a substrate in accordance with the measured volume of the droplet.

The at least one test table may include a first test table and a second test table, and a size of a droplet disposed on the second test table may be measured when measuring a surface profile of the first test table.

The at least one test table may include a first test table and a second test table, and a size of a droplet disposed on the first test table and a size of a droplet disposed on the second test table may be simultaneously measured.

The measuring of the volume of the droplet may include measuring a surface profile of a first region of the at least one test table and a surface profile of a second region of the at least one test table; and measuring a size of a droplet disposed on the first region and a size of a droplet disposed on the second region.

The disposing of the droplet on the at least one test table may include discharging the droplet to a film of the at least one test table, and collecting the film.

BRIEF DESCRIPTION OF THE DRAWINGS

The above and other aspects, features, and advantages of embodiments will be more apparent from the following description taken in conjunction with the accompanying drawings, in which.

DETAILED DESCRIPTION OF THE EMBODIMENTS

Figure 1:
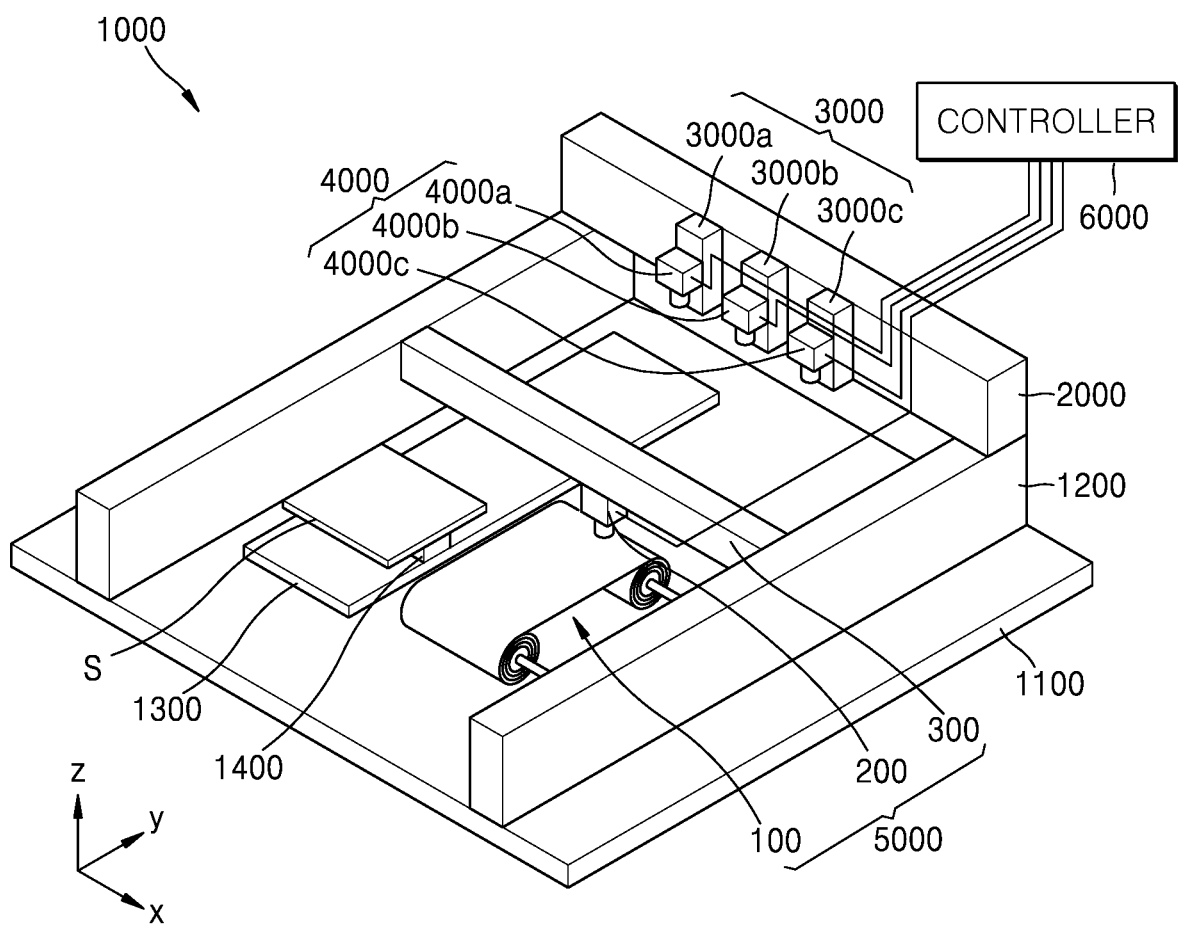
FIG. 1 is a schematic perspective view of an apparatus for manufacturing a display apparatus, according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

It is to be understood that although the embodiments refer to a liquid droplet, the droplet is not limited to that of a liquid, but may include other materials within the spirit and the scope of the disclosure.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Hereinafter, embodiments will be described in detail with reference to the accompanying drawings, wherein like reference numerals refer to like elements throughout and a repeated description thereof is omitted.

While such terms as "first" and "second" may be used to describe various components, such components must not be limited to the above terms. The above terms are used only to distinguish one component from another. For instance, a first element or component discussed below could be termed a second element or component without departing from the teachings of the disclosure. Similarly, the second element or component could also be termed the first element or component.

The singular forms "a," "an," and "the" as used herein are intended to include the plural forms as well unless the context clearly indicates otherwise.

It will be understood that the terms "comprise," "comprising," "include" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

In the drawings, sizes and thicknesses of elements may be enlarged for better understanding, clarity, and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

When an embodiment may be implemented differently, a process order may be performed differently from the described order. For example, two consecutively described processes may be performed substantially at the same time or performed in an order opposite to the described order.

It will be understood that when a layer, region, or component is referred to as being "connected" or "coupled" to another layer, region, or component, it may be "directly connected" or "directly coupled" to the other layer, region, or component and/or may be "indirectly connected" or "indirectly coupled" to the other layer, region, or component with other layers, regions, or components interposed therebetween. For example, it will be understood that when a layer, region, or component is referred to as being "electrically connected" to another layer, region, or component, it may be "directly electrically connected" to the other layer, region, or component and/or may be "indirectly electrically connected" to the other layer, region, or component with other layers, regions, or components interposed therebetween.

Also, when an element is referred to as being "in contact" or "contacted" or the like to another element, the element may be in "electrical contact" or in "physical contact" with another element, or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within 30%, 20%, 10%, 5% of the stated value.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

As used herein, the term "unit" denotes a structure or element as illustrated in the drawings and as described in the specification. However, the disclosure is not limited thereto. The term "unit" is not to be limited to that which is illustrated in the drawings.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
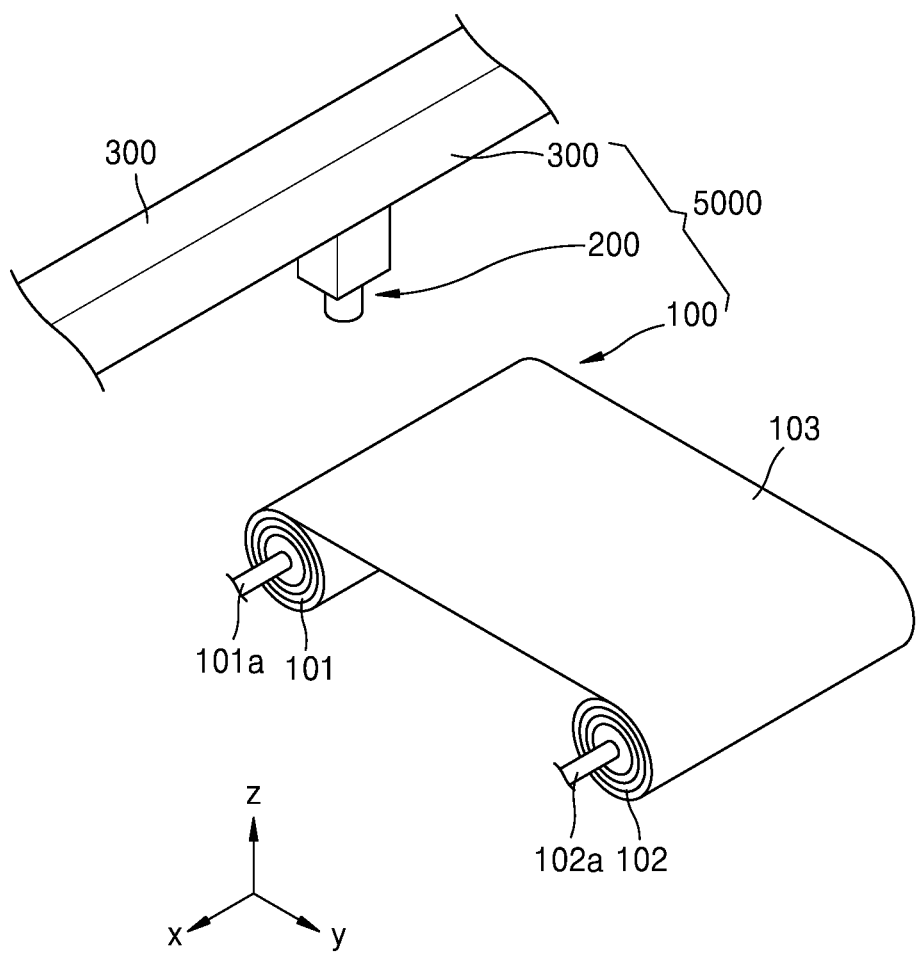
FIG. 2 is a schematic perspective view of a liquid droplet measurement portion of an apparatus for manufacturing a display apparatus, according to an embodiment.

FIG. 1 is a schematic perspective view of an apparatus 1000 for manufacturing a display apparatus, according to an embodiment. FIG. 2 is a schematic perspective view of a liquid droplet measurement portion 5000 of the apparatus 1000 for manufacturing a display apparatus, according to an embodiment.

Referring to FIGS. 1 and 2, the apparatus 1000 for manufacturing a display apparatus may include a stage 1100, a first gantry 2000, a movement portion 3000, a liquid droplet discharger 4000, the liquid droplet measurement portion 5000, and a controller 6000.

The stage 1100 may include guide members 1200 and a substrate moving member 1300. The stage 1100 may include an align mark (not shown) that may arrange a display substrate S.

In this regard, the display substrate S may be a display apparatus being manufactured. The display substrate S may include glass or polymer resin such as polyethersulfone, polyarylate, polyetherimide, polyethylene naphthalate, polyethylene terephthalate, polyphenylene sulfide, polyimide, polycarbonate (PC), cellulose triacetate (TAC), cellulose acetate propionate, for example, however the disclosure is not limited thereto.

The guide members 1200 may be spaced apart from each other with the substrate moving member 1300 therebetween. A length of the guide members 1200 may be greater than a length of edges of the display substrate S. In this regard, a length of the guide members 1200 and a length of edges of the display substrate S may be measured in a direction y of FIG. 1.

The first gantry 2000 may be arranged or disposed on the guide members 1200. In an embodiment, the guide members 1200 may include a constant rail which allows the first gantry 2000 to linearly move in a length direction of the guide members 1200. By way of example, the guide members 1200 may include a linear motion rail.

The substrate moving member 1300 may be arranged or disposed on the stage 1100 and may include a substrate rotating member 1400. The substrate moving member 1300 may extend in the length direction of the guide members 1200. For example, referring to FIG. 1, the substrate moving member 1300 may extend in the direction y. The substrate moving member 1300 may include a rail which may allow the substrate rotating member 1400 to move linearly. By way of example, the substrate moving member 1300 may include a linear motion rail.

The substrate rotating member 1400 may rotate on the substrate moving member 1300. In a case that the substrate rotating member 1400 rotates, the display substrate S arranged or disposed on the substrate rotating member 1400 may rotate. In an embodiment, the substrate rotating member 1400 may rotate on a rotation axis vertical to a surface of the stage 1100 on which the display substrate S may be seated. In a case that the substrate rotating member 1400 rotates on a rotation axis vertical to a surface of the stage 1100 on which the display substrate S may be seated, the display substrate S arranged or disposed on the substrate rotating member 1400 may also rotate on the rotation axis vertical to a surface of the stage 1100 on which the display substrate S may be seated.

The first gantry 2000 may be arranged or disposed on the guide members 1200. For example, the first gantry 2000 may be arranged or disposed on the guide members 1200 spaced apart from each other with the substrate moving member 1300 therebetween.

The first gantry 2000 may move in the length direction of the guide members 1200. In an embodiment, the first gantry 2000 may manually move linearly, or may include a motor cylinder, for example, and thus may move linearly automatically. For example, the first gantry 2000 may include a linear motion block moving along a linear motion rail and thus may move linearly automatically.

The movement portion 3000 and the liquid droplet discharger 4000 that may discharge a liquid droplet may be arranged or disposed on the first gantry 2000. In an embodiment, the movement portion 3000 may move linearly on the first gantry 2000. For example, the first gantry 2000 may include a constant rail which may allow the movement portion 3000 to move linearly.

A nozzle moving unit of the movement portion 3000 and a discharger of the liquid droplet discharger 4000 may be arranged or disposed in various ways. For example, one nozzle moving unit and one discharger may each be provided. In this case, at least one nozzle head that may discharge a liquid droplet from the discharger may be provided.

As an example, at least one discharger may be provided, and one nozzle moving unit may be provided. In this regard, in a case that dischargers may be provided, the dischargers may be arranged or disposed for one nozzle moving unit, and thus, the dischargers may move simultaneously as the nozzle moving unit moves.

As an example, nozzle moving units and dischargers may each be provided. In this regard, at least one discharger may be arranged or disposed for one nozzle moving unit. Hereinafter, for convenience of description, a case where one discharger is arranged or disposed for one nozzle moving unit will be mainly described in detail.

The movement portion 3000 may include nozzle moving units. In an embodiment, the movement portion 3000 may include a first nozzle moving unit 3000$a$, a second nozzle moving unit 3000$b$, and a third nozzle moving unit 3000$c$. In an embodiment, the movement portion 3000 may include at least one nozzle moving unit or may include four or more nozzle moving units. However, for convenience of description, a case where the movement portion 3000 includes the first nozzle moving unit 3000$a$, the second nozzle moving unit 3000$b$, and the third nozzle moving unit 3000$c$ will be mainly described in detail.

In an embodiment, a distance between the first nozzle moving unit 3000$a$ and the second nozzle moving unit 3000$b$ may be the same as a distance between the second nozzle moving unit 3000$b$ and the third nozzle moving unit 3000$c$. In an embodiment, a distance between the first nozzle moving unit 3000$a$ and the second nozzle moving unit 3000$b$ and a distance between the second nozzle moving unit 3000$b$ and the third nozzle moving unit 3000$c$ may be different from each other.

The movement portion 3000 may move linearly on the first gantry 2000. As an example, the movement portion 3000 may move in a length direction of the first gantry 2000. For example, at least one of the first nozzle moving unit 3000$a$, the second nozzle moving unit 3000$b$, or the third nozzle moving unit 3000$c$ may move in a direction x or a direction −x.

In an embodiment, the movement portion 3000 may move linearly manually. In an embodiment, the movement portion 3000 may include a motor cylinder, for example, and thus may move linearly automatically. For example, the movement portion 3000 may include a linear motion block moving along a linear motion rail.

A discharger of the liquid droplet discharger 4000 may be arranged or disposed on a nozzle moving unit of the movement portion 3000. For example, a first discharger 4000$a$ may be arranged or disposed on the first nozzle moving unit 3000$a$. As an example, a second discharger 4000$b$ may be arranged or disposed on the second nozzle moving unit 3000$b$. As an example, a third discharger 4000$c$ may be arranged or disposed on the third nozzle moving unit 3000$c$.

The liquid droplet discharger 4000 may discharge a liquid droplet to the display substrate S or a test table 100 described below. In this regard, a liquid droplet may be red, green, or blue ink in which pigment particles may be mixed in a liquid crystal solution or composition, an alignment solution, or a solvent. In an embodiment, a liquid droplet may be a polymer or low-molecular weight organic material corresponding to an emission layer of an organic light-emitting display apparatus.

The first discharger 4000$a$, the second discharger 4000$b$, and the third discharger 4000$c$ may each have an amount of a liquid droplet independently adjusted. In this regard, the first discharger 4000$a$, the second discharger 4000$b$, and the third discharger 4000$c$ may each be electrically connected to the controller 6000. Accordingly, the first discharger 4000$a$, the second discharger 4000$b$, and the third discharger 4000$c$ may each have an amount of a discharging droplet adjusted by the controller 6000.

The liquid droplet measurement portion 5000 may measure a liquid droplet discharged from the liquid droplet discharger 4000. As an example, a volume of a liquid droplet discharged from the liquid droplet discharger 4000 may be measured. Before the liquid droplet discharger 4000 discharges a liquid droplet to the display substrate S, the liquid droplet measurement portion 5000 may measure a volume of a liquid droplet discharged from the liquid droplet discharger 4000. In an embodiment, the liquid droplet measurement portion 5000 may measure a volume of a liquid droplet discharged from the liquid droplet discharger 4000 by measuring a surface profile of an object. The object may be an object to be measured such that the object may be the liquid droplet but the disclosure is not limited thereto. For example, the droplet may be a liquid droplet or a fluid droplet. In this regard, the surface profile of an object may be defined as a three-dimensional surface shape of the object. The surface profile of an object represents a curved degree of a surface, a groove, a protrusion, for example, of the object.

The liquid droplet measurement portion 5000 may include the test table 100, a profile measurement portion 200, and a second gantry 300.

The test table 100 may be arranged or disposed on the stage 1100. In this regard, the test table 100 may be arranged or disposed between the guide members 1200. In an embodiment, the apparatus 1000 for manufacturing a display apparatus may include at least one test table 100. For example, the apparatus 1000 for manufacturing a display apparatus may include test tables 100. Accordingly, amounts of liquid droplets discharged from dischargers may be simultaneously tested, and efficiency of a liquid droplet test may improve.

The test table 100 may include a film feeder 101 and a film collector 102. The film feeder 101 and the film collector 102 may be spaced apart from each other. In an embodiment, the film feeder 101 and the film collector 102 may be spaced apart from each other in the length direction of the guide members 1200. For example, the film feeder 101 and the film collector 102 may be spaced apart from each other in the direction y. In this regard, the film feeder 101 and the film collector 102 may be connected to the ground, the interior of a building, for example, and thus may be fixed.

The film feeder 101 may feed a film 103. The film 103 may be arranged or disposed in the form of a roll around the film feeder 101. In other words, the film 103 may be wound around the film feeder 101. The film feeder 101 may include a first axis 101a, and the first axis 101a may rotate to feed the film 103. The first axis 101a may be connected to a driver. Accordingly, the first axis 101a may be rotated by the driver.

The film collector 102 may collect the film 103. As an example, the film collector 102 may collect the film 103 fed by the film feeder 101. The film 103 may be arranged or disposed in the form of a roll around the film collector 102. For example, the film 103 where a discharged liquid droplet has been measured may be wound around the film collector 102. The film collector 102 may include a second axis 102a, and the second axis 102a may rotate to collect the film 103. The second axis 102a may be connected to a driver. Accordingly, the second axis 102a may be rotated by the driver.

The film 103 may be fed by the film feeder 101 and may be collected by the film collector 102. Accordingly, in a case that a liquid droplet discharged on a first portion of the film 103 has been tested, replacement may be made such that a second portion of the film 103 may face the liquid droplet discharger 4000. In this regard, the film 103 may include the same or similar material to the display substrate S. For example, the film 103 may be a glass film or may include polymer resin such as polyethersulfone, polyarylate, polyetherimide, polyethylene naphthalate, polyethylene terephthalate, polyphenylene sulfide, polyimide, PC, TAC, cellulose acetate propionate, etc, within the spirit and the scope of the disclosure.

Although, in an embodiment, the test table 100 includes the film feeder 101 and the film collector 102, in an embodiment, the test table 100 may include a test substrate. The test substrate may be replaced using a robot arm. The test substrate may include the same or similar material to the display substrate S or the film 103.

The profile measurement portion 200 may measure a surface profile of an object. For example, the profile measurement portion 200 may measure a three-dimensional surface shape of the object. The profile measurement portion 200 may be electrically connected to the controller 6000 to transmit a surface profile of the object to the controller 6000.

The profile measurement portion 200 may be a confocal microscope or an interferometric microscope or other microscope within the spirit and the scope of the disclosure. The confocal microscope may be a microscope that may obtain multiple two-dimensional images of an object at different depths, and based on the multiple two-dimensional images, may reconstruct a three-dimensional structure of the object.

The confocal microscope may be, for example, a chromatic confocal microscope, a chromatic line confocal microscope, or the like, within the spirit and the scope of the disclosure. The interferometric microscope may be a microscope that may observe and quantitatively measure changes in phase and irregularities of a microstructure of an object. The interferometric microscope may be, for example, a laser interferometric microscope, a white light interferometric microscope, or the like, within the spirit and the scope of the disclosure.

The liquid droplet measurement portion 5000 may include at least one profile measurement portion 200. For example, the liquid droplet measurement portion 5000 may include profile measurement portions 200. Accordingly, amounts of liquid droplets discharged from dischargers may be simultaneously tested, and efficiency of a liquid droplet test may improve.

The profile measurement portion 200 may move linearly along the second gantry 300 described below and may move linearly with the second gantry 300. As an example, the profile measurement portion 200 may move in a length direction of the second gantry 300. For example, the profile measurement portion 200 may move in the direction x or the direction -x. The profile measurement portion 200 may move linearly with the second gantry 300 as the second gantry 300 moves. For example, the profile measurement portion 200 may move with the second gantry 300 in the direction y or a direction -y.

The second gantry 300 may be arranged or disposed on the guide members 1200. For example, in a similar way to the first gantry 2000, the second gantry 300 may be arranged or disposed on the guide members 1200 spaced apart from each other with the test table 100 therebetween.

The second gantry 300 may move in the length direction of the guide members 1200. In an embodiment, the second gantry 300 may move linearly manually, or may include a motor cylinder, for example, and thus may move linearly automatically. For example, the second gantry 300 may include a linear motion block moving along a linear motion rail and thus may move linearly automatically.

Although FIG. 1 shows the profile measurement portion 200 connected to the second gantry 300, in an embodiment, the first gantry 2000 and the second gantry 300 may be integrally provided or disposed. For example, the profile measurement portion 200 may be spaced apart from the movement portion 3000, or the profile measurement portion 200 may be arranged or disposed on the movement portion 3000 in a similar way to the liquid droplet discharger 4000. However, for convenience of description, a case where the apparatus 1000 for manufacturing a display apparatus includes the second gantry 300 and the profile measurement portion 200 is connected to the second gantry 300 will be mainly described in detail.

The controller 6000 may measure a volume of a liquid droplet discharged on the test table 100 by using a surface profile of an object measured by the profile measurement portion 200. In an embodiment, the controller 6000 may measure, by using a surface profile of the test table 100 measured by the profile measurement portion 200 and a surface profile of a discharged liquid droplet on the test table 100 measured by the profile measurement portion 200, a volume of the discharged liquid droplet.

Hereinafter, operation of the apparatus 1000 for manufacturing a display apparatus, a method of measuring a liquid droplet by using the apparatus 1000 for manufacturing a display apparatus, and a method of manufacturing a display apparatus by using the apparatus 1000 for manufacturing a display apparatus will be described in detail.

Figure 3A:
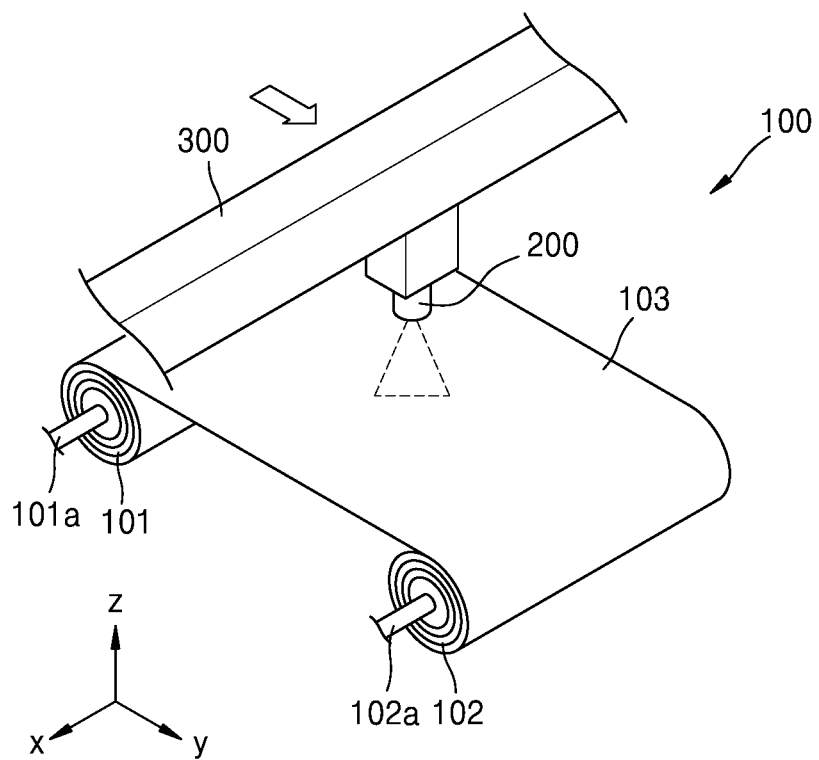
FIG. 3A is a schematic perspective view of a method of operating the apparatus for manufacturing a display apparatus shown in FIGS. 1 and 2.
Figure 3B:
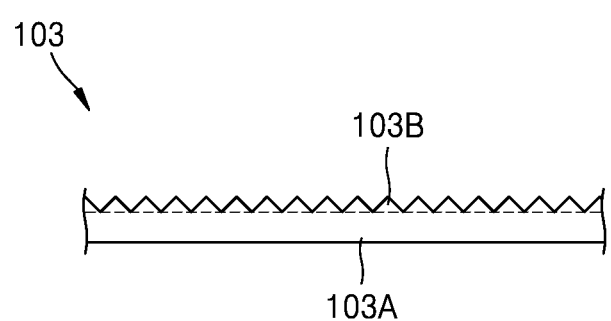
FIG. 3B is a schematic cross-sectional view of a portion of a film shown in FIG. 3A.
Figure 3C:
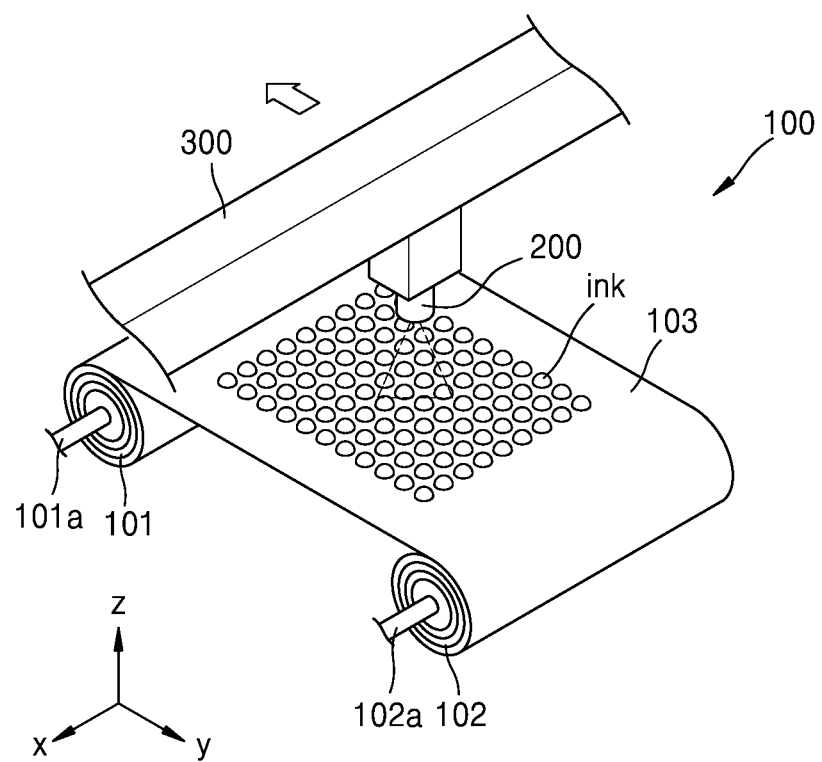
FIG. 3C is a schematic perspective view of a method of operating the apparatus for manufacturing a display apparatus shown in FIGS. 1 and 2.
Figure 3D:
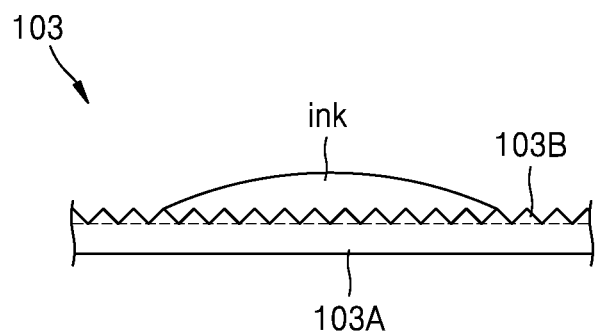
FIG. 3D is a schematic cross-sectional view of a portion of a film shown in FIG. 3C.
Figure 3E:
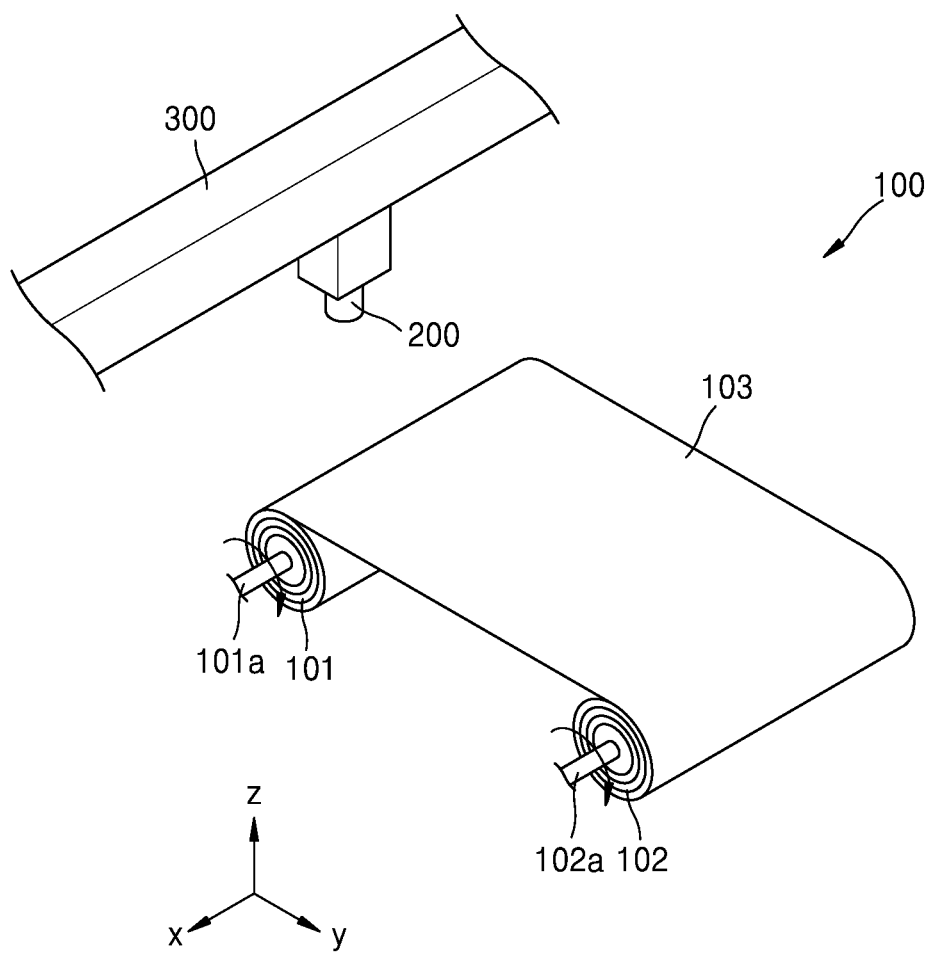
FIG. 3E is a schematic perspective view of a method of operating the apparatus for manufacturing a display apparatus shown in FIGS. 1 and 2.

FIG. 3A is a schematic perspective view of a method of operating the apparatus 1000 shown in FIGS. 1 and 2. FIG. 3B is a schematic cross-sectional view of a portion of the film 103 shown in FIG. 3A. FIG. 3C is a schematic perspective view of a method of operating the apparatus 1000 shown in FIGS. 1 and 2. FIG. 3D is a schematic cross-sectional view of a portion of the film 103 shown in FIG. 3C. FIG. 3E is a schematic perspective view of a method of operating the apparatus 1000 shown in FIGS. 1 and 2.

Referring to FIGS. 3A and 3B, the film 103 may be fed. The film 103 may be fed by the film feeder 101. In this regard, the first axis 101a and the second axis 102a may rotate.

The profile measurement portion 200 may measure a surface profile of the test table 100. As an example, a surface profile of the film 103 may be measured. In this regard, the second gantry 300 may move in the direction y or the direction -y, and the second gantry 300 may move the profile measurement portion 200 in the direction y or the direction -y. The profile measurement portion 200 may face the film 103 to measure a surface profile of the film 103.

The film 103 may include a base portion 103A and a protrusion or protrusions 103B on the base portion 103A. In this regard, the protrusion 103B represents a fine projection on the base portion 103A. Protrusions 103B may be on the base portion 103A. Although FIG. 3B shows that distances between adjacent protrusions 103B may all be the same, one from among distances between the protrusions 103B may be different from another from among the distances between the protrusions 103B. Although FIG. 3B shows that heights of the adjacent protrusions 103B may all be the same, a height of one from among the protrusions 103B may be different from a height of another from among the protrusions 103B. In this regard, a height of the protrusion 103B may be a distance from the base portion 103A to an end of the protrusion 103B.

In an embodiment, measuring a surface profile of the film 103 may be to measure an accurate volume in a case that a liquid droplet is discharged on the film 103 including the protrusion 103B as described above. Different from the embodiment, in a case that only an amount of a liquid droplet discharged on the film 103 is measured without measuring a surface profile of the film 103, it may not be possible to measure an accurate volume of the liquid droplet due to a fine groove, a protrusion, or a curved degree of a surface arranged or disposed on the film 103, and an error may occur from an actual volume of the liquid droplet. In an embodiment, a surface profile of the film 103 may be measured, and an accurate volume of the liquid droplet may be measured by reflecting the surface profile of the film 103.

Referring to FIGS. 3C and 3D, a liquid droplet (ink) may be discharged on the test table 100. In this regard, a liquid droplet discharger (not shown) may face the test table 100, and a liquid droplet may be discharged on the test table 100 from the liquid droplet discharger.

A surface profile of the discharged liquid droplet (ink) may be measured. The profile measurement portion 200 may measure a surface profile of the discharged liquid droplet (ink). In this regard, the second gantry 300 may move in the direction y or the direction -y, and the second gantry 300 may move the profile measurement portion 200 in the direction y or the direction -y. The profile measurement portion 200 may face the liquid droplet (ink) to measure a surface profile of the liquid droplet (ink).

A controller (not shown) may measure a volume of the discharged liquid droplet (ink) by reflecting a surface profile of the test table 100 in a surface profile of the discharged liquid droplet (ink). As an example, the controller may measure information on a space occupied by the discharged liquid droplet (ink) from a difference between the surface profile of the liquid droplet (ink) disposed on the test table 100 and the surface profile of the test table 100. Accordingly, an accurate volume of the discharged liquid droplet (ink) may be measured.

In an embodiment, the controller may compare an accurate volume of the discharged liquid droplet (ink) obtained from a liquid droplet measurement portion with a volume of a liquid droplet preset to be discharged from the liquid droplet discharger. For example, the controller may set an approximately 1 ml droplet to be discharged from a first discharger. The first discharger may discharge a preset droplet (about 1 ml) at the liquid droplet measurement portion. In this regard, in a case that an accurate volume of a discharged liquid droplet obtained from the liquid droplet measurement portion is not about 1 ml, the controller may change a volume of a liquid droplet preset to be discharged from the first discharger. By repeating the above process, the liquid droplet discharger may discharge a liquid droplet as much as a volume of a liquid droplet originally intended to be discharged. Accordingly, a volume of a liquid droplet discharged by the liquid droplet discharger may be precisely controlled.

Referring to FIG. 3E, the film 103 may be collected to the film collector 102. In this regard, the first axis 101a and the second axis 102a may rotate. Accordingly, from among the film 103, a film portion where a discharged liquid droplet may be arranged or disposed may be collected to the film collector 102, and a new film portion may be fed from the film feeder 101. The above measurement process may be repeated.

In an embodiment, an accurate volume of the liquid droplet (ink) discharged from the liquid droplet discharger may be measured. The liquid droplet (ink) may be discharged to or disposed on a display substrate (not shown) by reflecting the measured volume of the liquid droplet (ink). An apparatus for manufacturing a display apparatus may discharge a liquid droplet having an accurate volume to a location of the display substrate requiring a preset volume of a liquid droplet. Accordingly, precision of the apparatus for manufacturing a display apparatus may improve. Thus, a problem such as spots caused by a volume difference of liquid droplets dropped by location on the display substrate may be solved.

Figure 4:
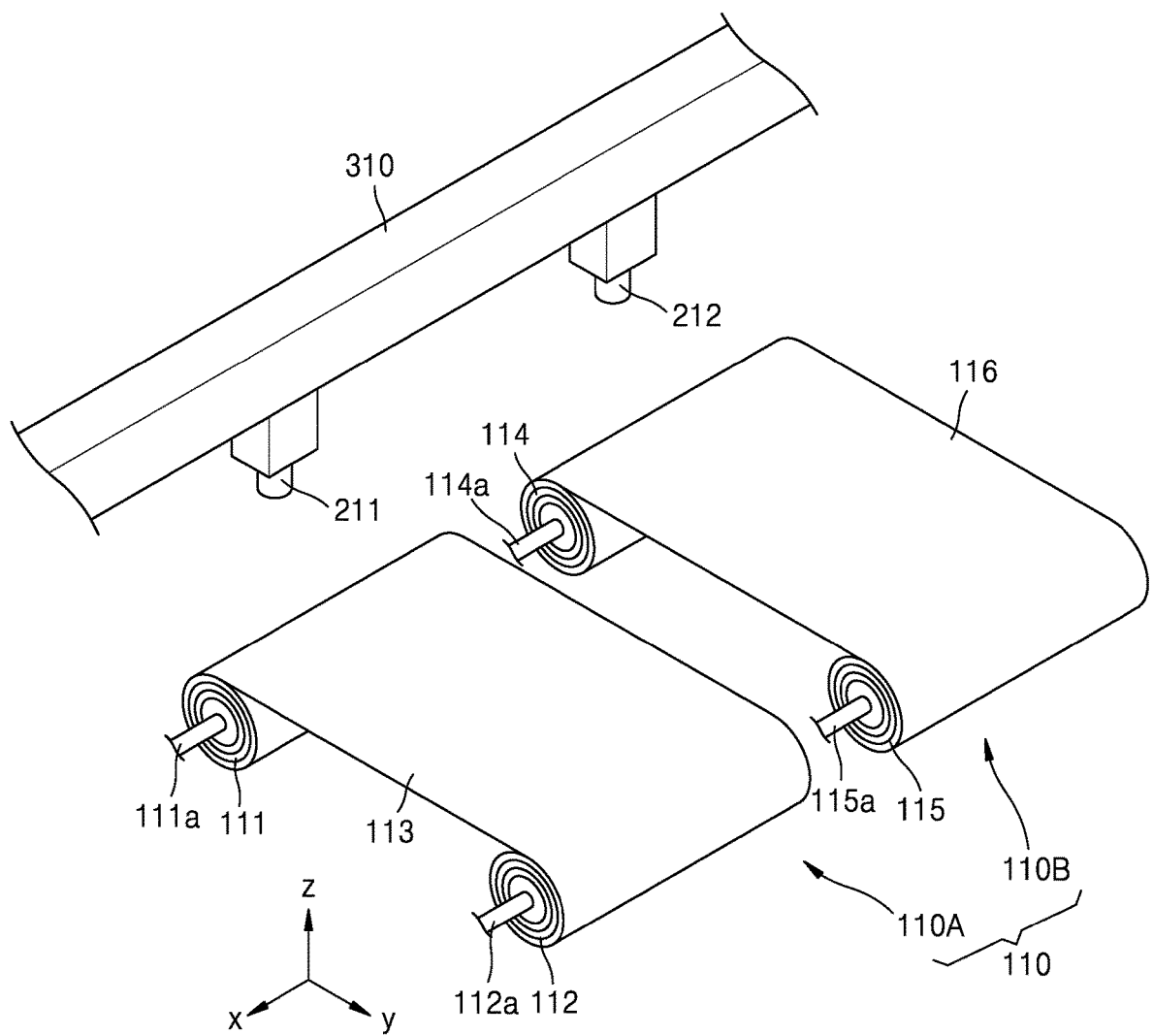
FIG. 4 is a schematic perspective view of a portion of a liquid droplet measurement portion according to an embodiment.

FIG. 4 is a schematic perspective view of a portion of a liquid droplet measurement portion according to an embodiment.

Referring to FIG. 4, the liquid droplet measurement portion may include a test table, for example, first and second test tables 110A and 110B, a profile measurement portion, for example, first and second profile measurement portions 211 and 212, and a second gantry 310. In this regard, the second gantry 310 of FIG. 4 may be the same as or similar to the second gantry 300 of FIG. 2, and thus, a detailed description thereof may be omitted. It is to be understood that the first and second test tables 110A and 110B may be collectively referred to as 110 in FIG. 4.

The test table, for example, the first and second test tables 110A and 110B, may be arranged or disposed on the stage 1100. In this regard, the test table may include test tables, for example, the first and second test tables 110A and 110B. For example, the test tables, for example, the first and second test tables 110A and 110B, may include the first test table 110A and the second test table 110B. As an example, the test table, for example, the first and second test tables 110A and 110B, may include a third test table or more test tables. However, for convenience of description, a case where the test tables, for example, the first and second test tables 110A and 110B, include the first test table 110A and the second test table 110B, will be mainly described in detail.

The first test table 110A and the second test table 110B may be spaced apart from each other. Although the first test table 110A and the second test table 110B are shown as being spaced apart from each other in the direction x, in an embodiment, the first test table 110A and the second test table 110B may be spaced apart from each other in the direction y.

The first test table 110A may include a first film feeder 111 and a first film collector 112. A first film 113 may be fed by the first film feeder 111 and may be collected by the first film collector 112. The first film feeder 111 may include a first feeding axis 111a, and the first film collector 112 may include a first collecting axis 112a. The first film feeder 111, the first feeding axis 111a, the first film collector 112, the first collecting axis 112a, and the first film 113 may be the same as or similar to the film feeder 101, the first axis 101a, the film collector 102, the second axis 102a, and the film 103 of FIG. 2, and thus, a detailed description thereof may be omitted.

The second test table 110B may include a second film feeder 114 and a second film collector 115. A second film 116 may be fed by the second film feeder 114 and may be collected by the second film collector 115. The second film feeder 114 may include a second feeding axis 114a, and the second film collector 115 may include a second collecting axis 115a. The second film feeder 114, the second feeding axis 114a, the second film collector 115, the second collecting axis 115a, and the second film 116 may be the same as or similar to the film feeder 101, the first axis 101a, the film collector 102, the second axis 102a, and the film 103 of FIG. 2, and thus, a detailed description thereof may be omitted.

The profile measurement portion, for example, the first and second profile measurement portions 211 and 212, may measure a surface profile of an object. In this regard, the profile measurement portion, for example, the first and second profile measurement portions 211 and 212, may include profile measurement portions. For example, the profile measurement portion, that is, the first and second profile measurement portions 211 and 212, may include the first profile measurement portion 211 and the second profile measurement portion 212. As an example, the profile measurement portion, for example, the first and second profile measurement portions 211 and 212, may include a third profile measurement portion or more profile measurement portions. However, for convenience of description, a case where the profile measurement portions, for example, the first and second profile measurement portions 211 and 212, include the first profile measurement portion 211 and the second profile measurement portion 212 will be mainly described in detail.

In an embodiment, the first profile measurement portion 211 and the second profile measurement portion 212 may be connected to the second gantry 310. In an embodiment, the first profile measurement portion 211 and the second profile measurement portion 212 may not be arranged or disposed on the same gantry. For example, the first profile measurement portion 211 may be arranged or disposed on the second gantry 310, and the second profile measurement portion 212 may be arranged or disposed on a third gantry similar to the second gantry 310.

The first profile measurement portion 211 may correspond to the first test table 110A, and the second profile measurement portion 212 may correspond to the second test table 110B. The first profile measurement portion 211 may move above the first test table 110A. For example, the first profile measurement portion 211 may move in a direction from the first film feeder 111 to the first film collector 112. The second profile measurement portion 212 may move above the second test table 110B. For example, the second profile measurement portion 212 may move in a direction from the second film feeder 114 to the second film collector 115.

The first profile measurement portion 211 may measure a surface profile of the first test table 110A, and the second profile measurement portion 212 may measure a surface profile of the second test table 110B. The first profile measurement portion 211 may measure a surface profile of a liquid droplet discharged to or disposed on the first test table 110A, and the second profile measurement portion 212 may measure a surface profile of a liquid droplet discharged to or disposed on the second test table 110B.

The first profile measurement portion 211 may transmit the surface profile of the first test table 110A and the surface profile of a liquid droplet discharged to or disposed on the first test table 110A to a controller (not shown). The second profile measurement portion 212 may transmit the surface profile of the second test table 110B and the surface profile of a liquid droplet discharged to or disposed on the second test table 110B to the controller.

FIGS. 5A to 5D are schematic perspective views of a method of operating the liquid droplet measurement portion shown in FIG. 4, according to an embodiment.

Figure 5A:
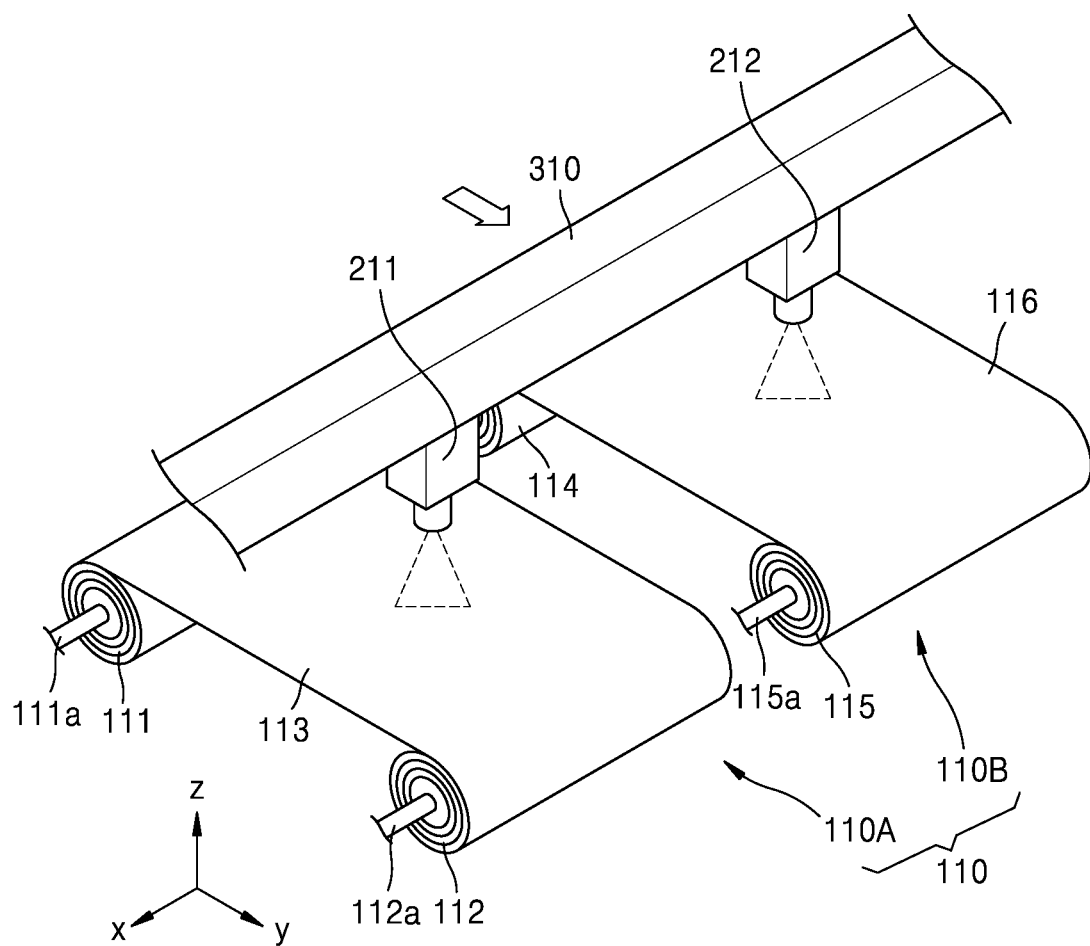
FIGS. 5A to 5D are schematic perspective views of a method of operating the liquid droplet measurement portion shown in FIG. 4, according to an embodiment.

Referring to FIG. 5A, the first film 113 and the second film 116 may be fed. The first film 113 may be fed by the first film feeder 111, and the second film 116 may be fed by the second film feeder 114. In this regard, the first feeding axis 111a and the first collecting axis 112a may rotate, and the second feeding axis 114a and the second collecting axis 115a may also rotate.

The first profile measurement portion 211 and the second profile measurement portion 212 may measure a surface profile of the first test table 110A and a surface profile of the second test table 110B, respectively. Although FIG. 5A shows the first profile measurement portion 211 and the second profile measurement portion 212 moving in the same direction, in an embodiment, in a case that the first profile measurement portion 211 is arranged or disposed under or below the second gantry 310, and the second profile measurement portion 212 is arranged or disposed under or below the second gantry 310 and the third gantry, a direction in which the first profile measurement portion 211 moves and a direction in which the second profile measurement portion 212 moves may be different from each other.

Figure 5B:
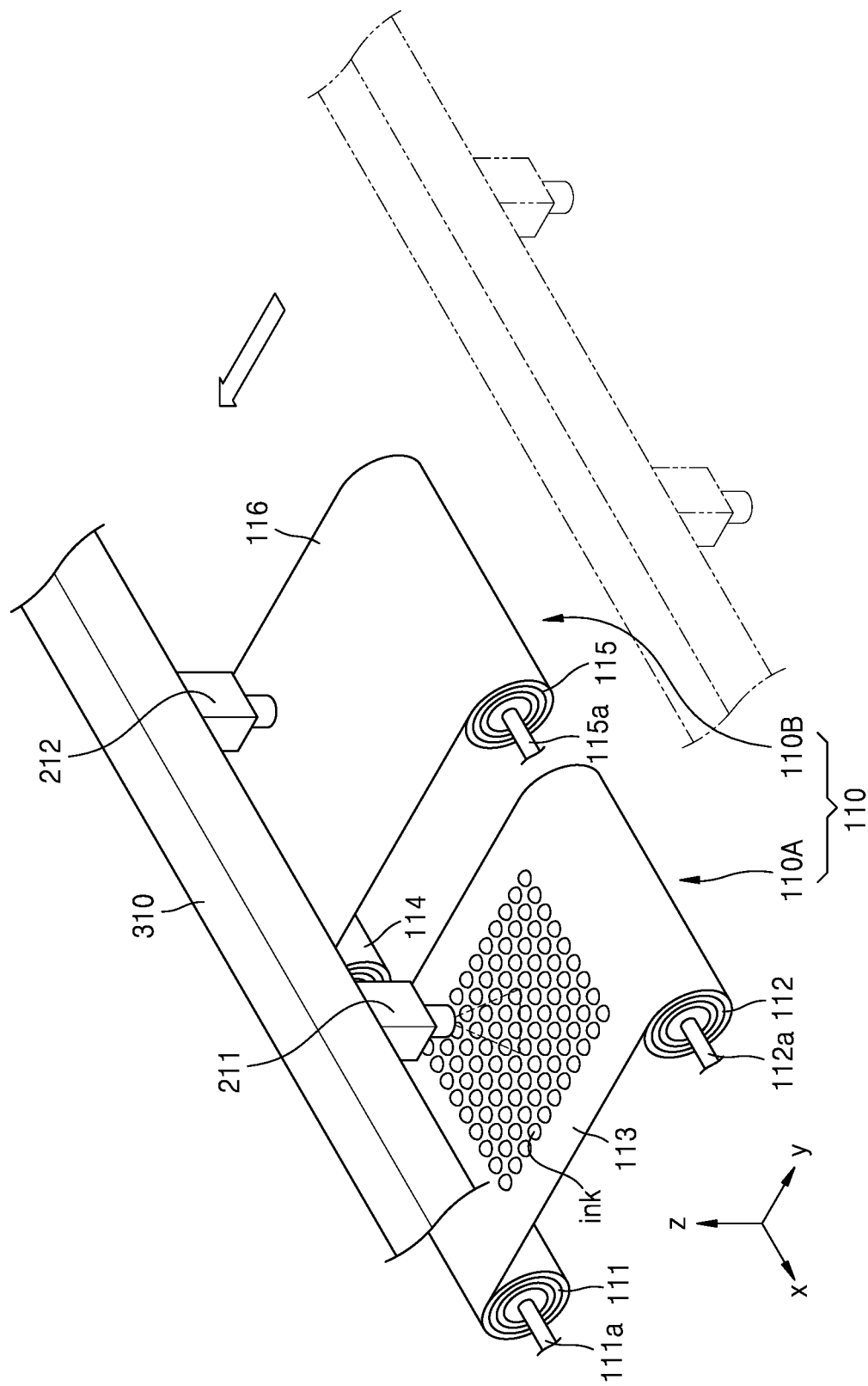

Referring to FIG. 5B, a liquid droplet (ink) may be discharged on the first test table 110A. In this regard, a liquid droplet discharger (not shown) may face the first test table 110A, and the liquid droplet (ink) may be discharged on the first test table 110A from the liquid droplet discharger.

A surface profile of the liquid droplet (ink) discharged on the first test table 110A may be measured. The first profile measurement portion 211 may measure a surface profile of the liquid droplet (ink) discharged on the first test table 110A.

A controller (not shown) may measure a volume of a liquid droplet discharged on the first test table 110A by reflecting a surface profile of the first test table 110A in a surface profile of the liquid droplet discharged on the first test table 110A.

The first film 113 may be collected to the first film collector 112. In this regard, the first feeding axis 111a and the first collecting axis 112a may rotate. Accordingly, from among the first film 113, a first film portion where a discharged liquid droplet may be arranged or disposed may be collected to the first film collector 112, and a new first film portion may be fed from the first film feeder 111.

A liquid droplet (ink) may be discharged on the second test table 110B. In this regard, the liquid droplet discharger (not shown) may face the second test table 110B, and the liquid droplet (ink) may be discharged on the second test table 110B from the liquid droplet discharger.

Figure 5C:
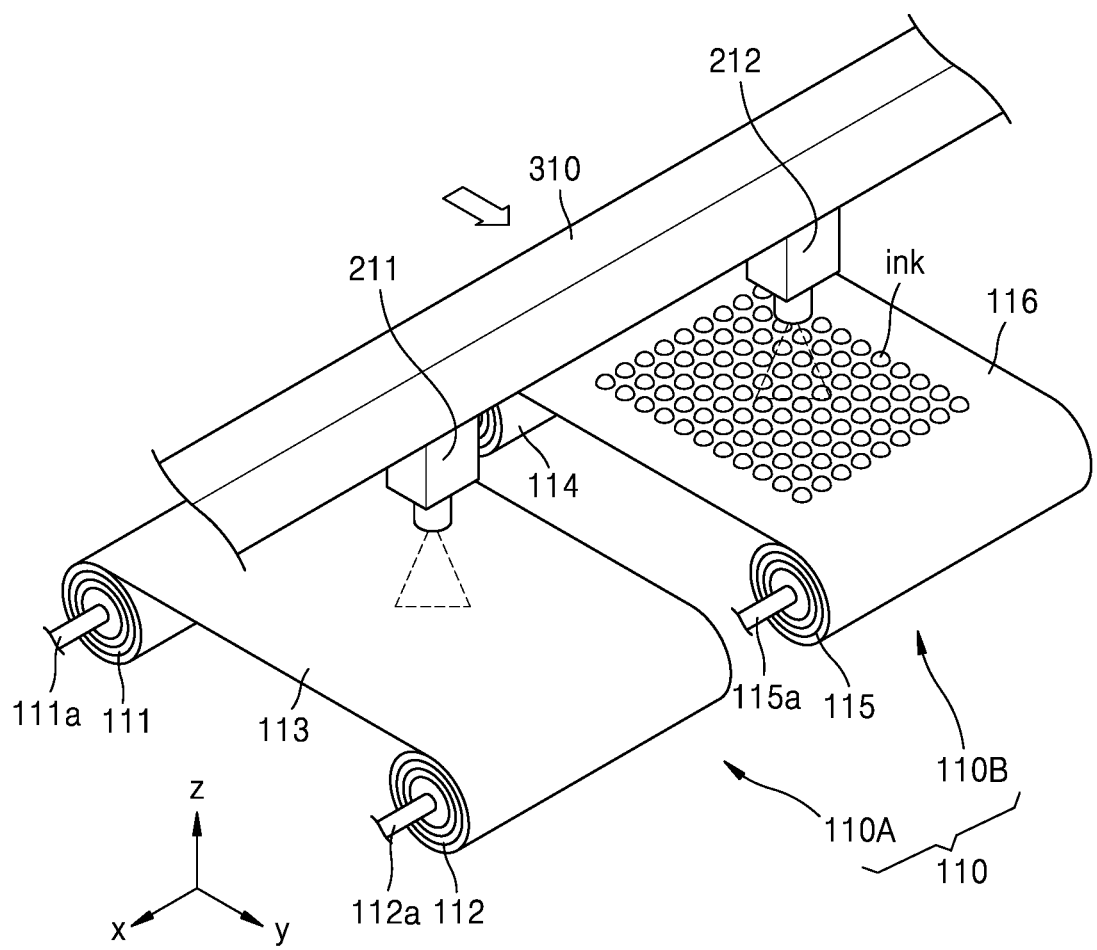

Referring to FIG. 5C, in a case that a surface profile of the first test table 110A is measured, a surface profile of the liquid droplet (ink) discharged on the second test table 110B may be measured. The first profile measurement portion 211 may measure a surface profile of the first test table 110A, and at the same time, the second profile measurement portion 212 may measure a surface profile of the liquid droplet (ink) discharged on the second test table 110B.

The controller (not shown) may measure a volume of a liquid droplet discharged on the second test table 110B by reflecting a surface profile of the second test table 110B in a surface profile of the liquid droplet discharged on the second test table 110B.

The second film 116 may be collected to the second film collector 115. In this regard, the second feeding axis 114a and the second collecting axis 115a may rotate. Accordingly, from among the second film 116, a second film portion where a discharged liquid droplet may be arranged or disposed may be collected to the second film collector 115, and a new second film portion may be fed from the second film feeder 114.

A liquid droplet (ink) may be discharged on the first test table 110A. In this regard, the liquid droplet discharger (not shown) may face the first test table 110A, and the liquid droplet (ink) may be discharged on the first test table 110A from the liquid droplet discharger.

Figure 5D:
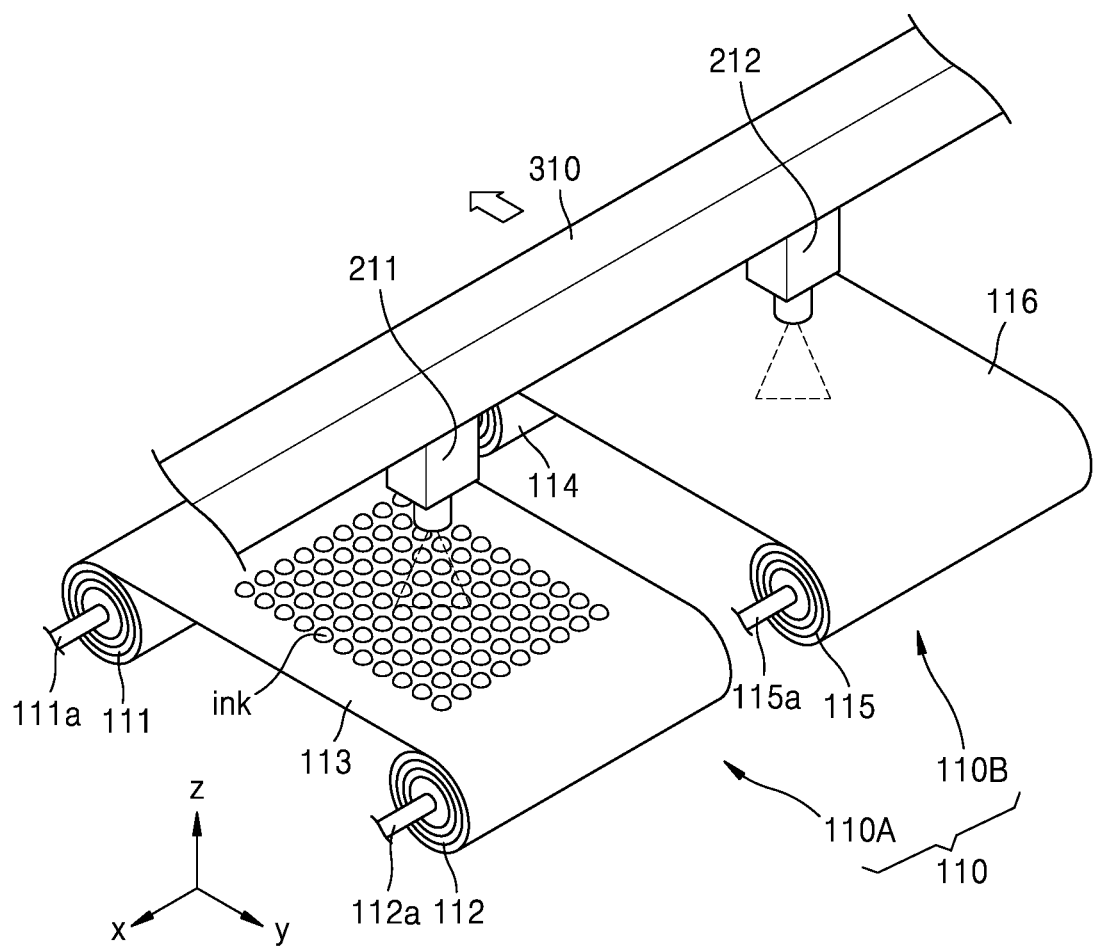

Referring to FIG. 5D, in a case that a surface profile of the liquid droplet (ink) discharged on the first test table 110A is measured, a surface profile of the second test table 110B may be measured. The first profile measurement portion 211 may measure a surface profile of the liquid droplet (ink) discharged on the first test table 110A, and at the same time, the second profile measurement portion 212 may measure a surface profile of the second test table 110B.

The first film 113 may be collected by the first film collector 112 again, a liquid droplet (ink) may be discharged on the second test table 110B, and while a surface profile of the first test table 110A is measured, a surface profile of the liquid droplet (ink) discharged on the second test table 110B may be measured. The above measurement process may be repeated.

As in an embodiment, while a surface profile of one from among test tables, for example, the first and second test tables 110A and 110B, is measured, a surface profile of a liquid droplet discharged on the other from among the test tables, for example, the first and second test tables 110A and 110B, may be measured, and thus, a time required to measure a volume of liquid droplets may decrease, and productivity of an apparatus for manufacturing a display apparatus may improve.

Figure 6A:
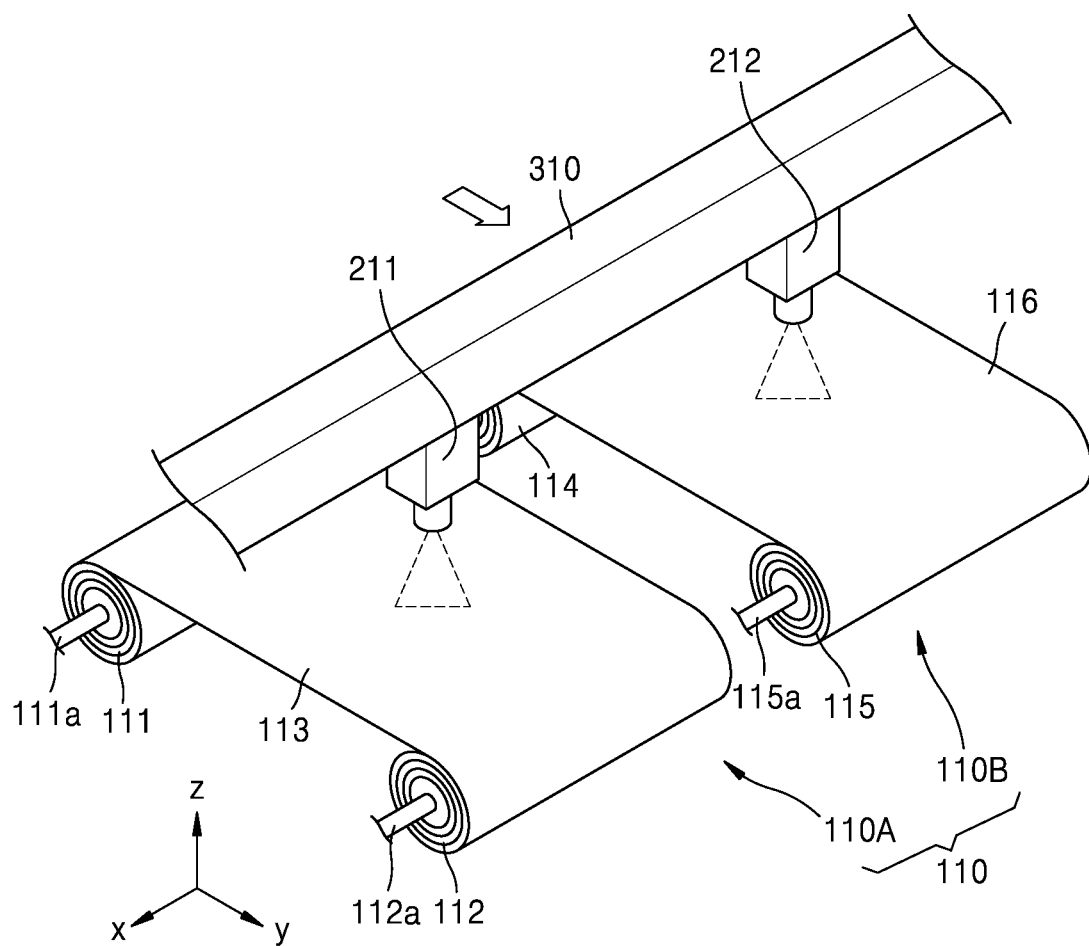
FIGS. 6A and 6B are schematic perspective views of a method of operating the liquid droplet measurement portion shown in FIG. 4, according to an embodiment.
Figure 6B:
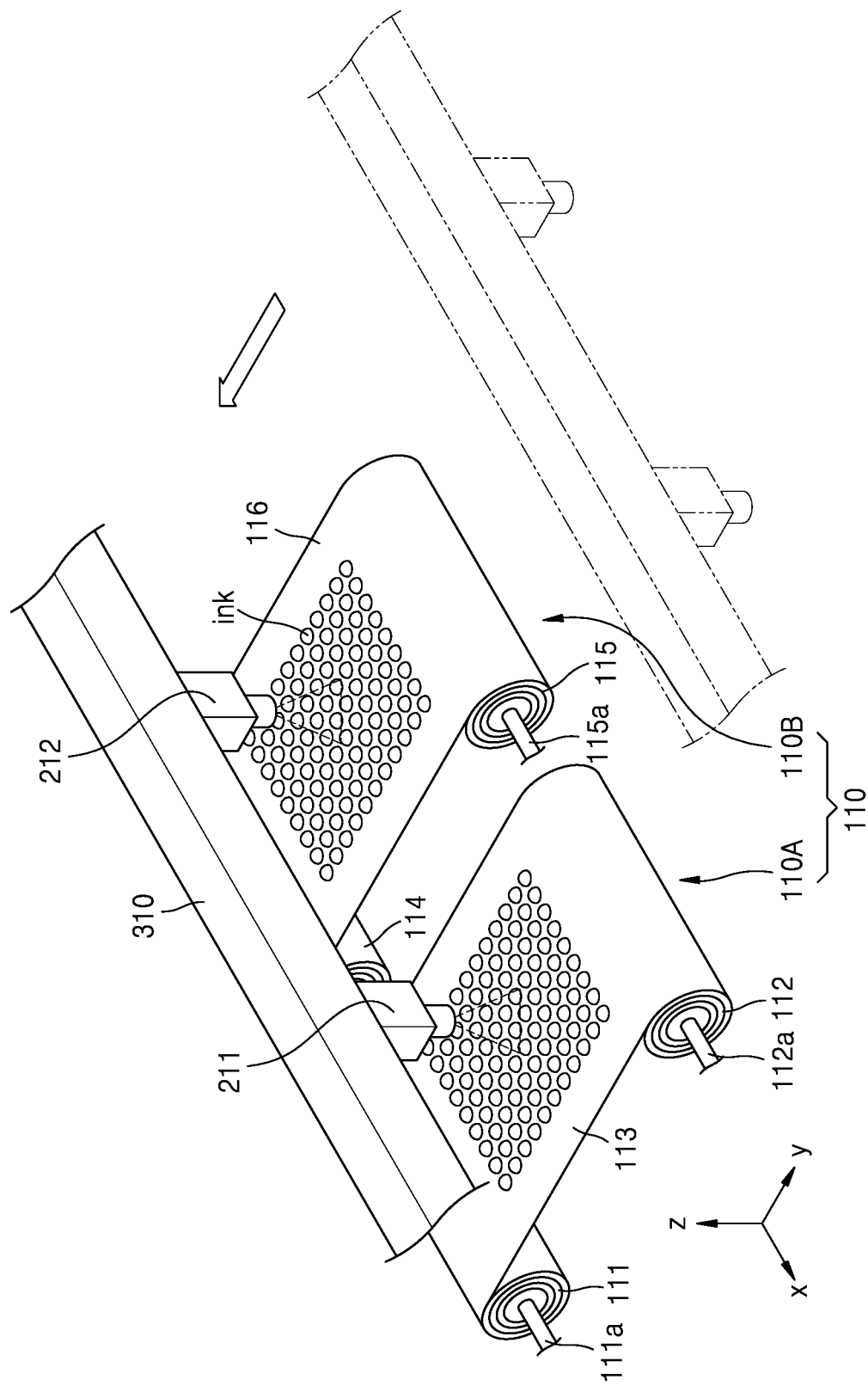

FIGS. 6A and 6B are schematic perspective views of a method of operating the liquid droplet measurement portion shown in FIG. 4, according to an embodiment.

Referring to FIG. 6A, the first film 113 and the second film 116 may be fed. The first film 113 may be fed by the first film feeder 111, and the second film 116 may be fed by the second film feeder 114. In this regard, the first feeding axis 111a and the first collecting axis 112a may rotate, and the second feeding axis 114a and the second collecting axis 115a may rotate.

A surface profile of the first test table 110A and a surface profile of the second test table 110B may be simultaneously measured. For example, the first profile measurement portion 211 and the second profile measurement portion 212 may simultaneously measure a surface profile of the first test table 110A and a surface profile of the second test table 110B, respectively.

Referring to FIG. 6B, liquid droplets (ink) may be discharged on the first test table 110A and the second test table 110B, respectively. In this regard, a liquid droplet discharger (not shown) may face the first test table 110A and the second test table 110B, and the liquid droplets (ink) may be discharged on the first test table 110A and the second test table 110B, respectively, from the liquid droplet discharger.

Surface profiles of the liquid droplets (ink) discharged on the first test table 110A and the second test table 110B may be simultaneously measured. The first profile measurement portion 211 and the second profile measurement portion 212 may simultaneously measure surface profiles of the liquid droplets (ink) discharged on the first test table 110A and the second test table 110B, respectively.

In this regard, a controller (not shown) may measure a volume of a liquid droplet discharged on the first test table 110A by reflecting a surface profile of the first test table 110A in a surface profile of the liquid droplet discharged on the first test table 110A. The controller (not shown) may measure a volume of a liquid droplet discharged on the second test table 110B by reflecting a surface profile of the second test table 110B in a surface profile of the liquid droplet discharged on the second test table 110B.

The first film 113 may be collected to the first film collector 112, and the second film 116 may be collected to the second film collector 115.

A surface profile of the first test table 110A and a surface profile of the second test table 110B may be simultaneously measured again. The above measurement process may be repeated.

As in an embodiment, profile measurement portions, for example, the first and second profile measurement portions 211 and 212, may measure surface profiles of test tables, for example, the first and second test tables 110A and 110B, and surface profiles of liquid droplets discharged on the test tables, for example, the first and second test tables 110A and 110B, and thus, a time required to measure a volume of liquid droplets may decrease, and productivity of an apparatus for manufacturing a display apparatus may improve.

Figure 7:
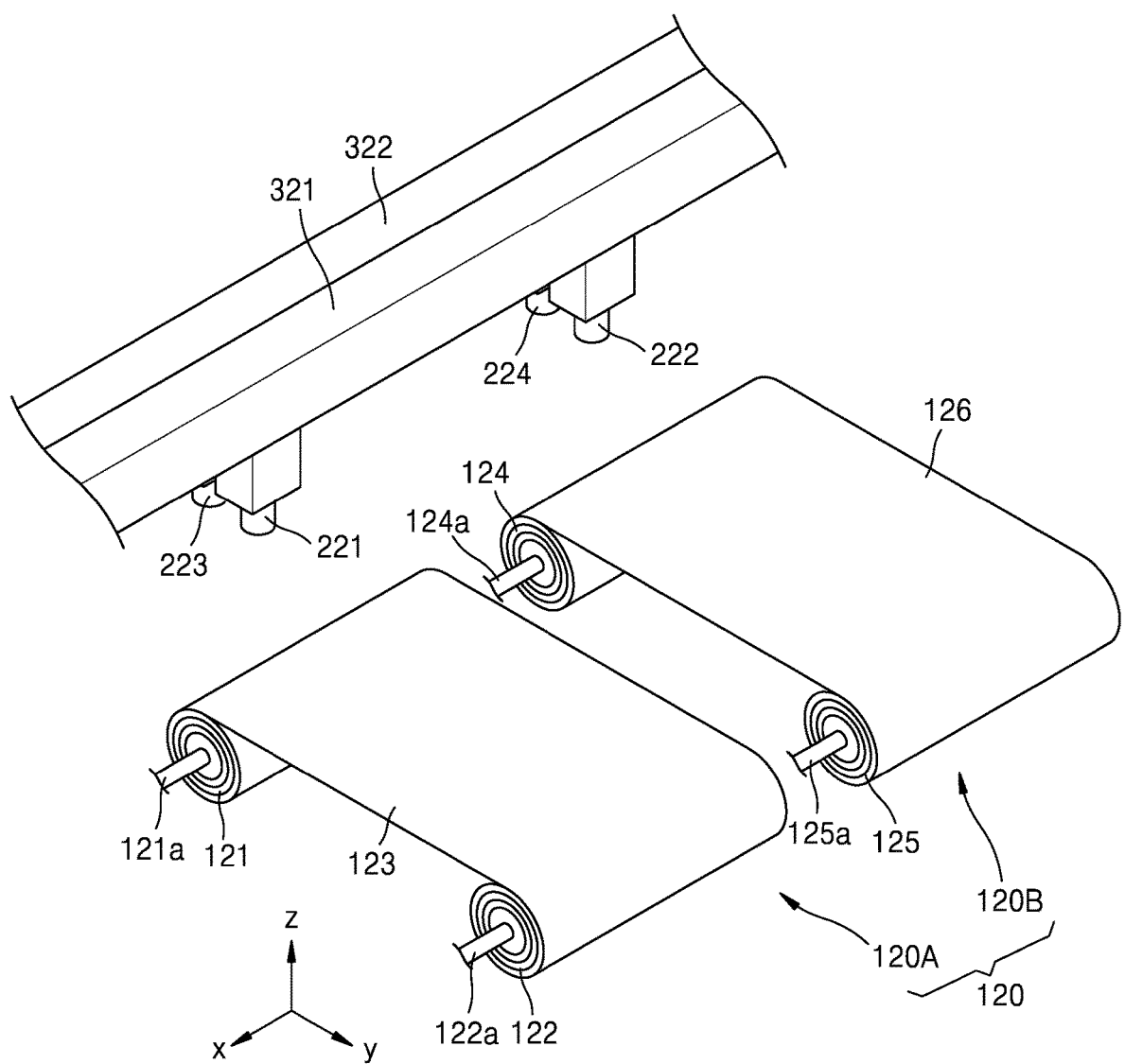
FIG. 7 is a schematic perspective view of a portion of a liquid droplet measurement portion according to an embodiment.

FIG. 7 is a schematic perspective view of a portion of a liquid droplet measurement portion according to an embodiment.

Referring to FIG. 7, the liquid droplet measurement portion may include a test table, for example, first and second test tables 120A and 120B, a profile measurement portion, for example, first and second profile measurement portions 221 and 222, and a second gantry 321. The test table, for example, the first and second test tables 120A and 120B, the profile measurement portion, for example, the first and second profile measurement portions 221 and 222, and the second gantry 321 of FIG. 7 may be the same as or similar to the test table, for example, the first and second test tables 110A and 110B, the profile measurement portion, for example, the first and second profile measurement portions 211 and 212, and the second gantry 310 of FIG. 4, respectively, and thus, a detailed description thereof may be omitted. It is to be understood that the first and second test tables 120A and 120B may be collectively referred to as 120 in FIG. 7.

In an embodiment, the liquid droplet measurement portion may include a size measurement portion, for example, first and second size measurement portions 223 and 224. The size measurement portion, for example, the first and second size measurement portions 223 and 224, may measure a size of a liquid droplet discharged to or disposed on the test table, for example, the first and second test tables 120A and 120B. In this regard, the size measurement portion, for example, the first and second size measurement portions 223 and 224, may be a camera, and a size of the discharged liquid droplet may be defined as a radius or diameter of the liquid droplet. As an example, the size measurement portion, for example, the first and second size measurement portions 223 and 224, may obtain a two-dimensional image of an object and may measure a radius of the liquid droplet from the two-dimensional image. In this regard, the radius of a liquid droplet may be measured with a distance from a center of the liquid droplet to an end of the liquid droplet.

The liquid droplet measurement portion may include at least one size measurement portion, for example, the first and second size measurement portions 223 and 224. In an embodiment, the liquid droplet measurement portion may include size measurement portions, for example, the first and second size measurement portions 223 and 224. For example, the size measurement portions, for example, the first and second size measurement portions 223 and 224, may include the first size measurement portion 223 and the second size measurement portion 224. In an example, the size measurement portions, for example, the first and second size measurement portions 223 and 224, may include a third size measurement portion or may include more size measurement portions. Accordingly, amounts of liquid droplets discharged from dischargers may be simultaneously tested, and efficiency of a liquid droplet test may improve. Hereinafter, a case where the size measurement portions, for example, the first and second size measurement portions 223 and 224, include the first size measurement portion 223 and the second size measurement portion 224 will be mainly described in detail.

The size measurement portion, for example, the first and second size measurement portions 223 and 224, may be connected to a third gantry 322 similar to the second gantry 321. In an embodiment, the third gantry 322 may move in the same manner as the second gantry 321. As an example, the third gantry 322 may always move in the same manner as the second gantry 321. In an embodiment, the third gantry 322 may move independently of the second gantry 321. Hereinafter, a case where the third gantry 322 moves in the same manner as the second gantry 321 will be mainly described in detail.

In an embodiment, the first size measurement portion 223 may correspond to the first test table 120A, and the second size measurement portion 224 may correspond to the second test table 120B. For example, the first size measurement portion 223 may move in a direction from a first film feeder 121 to a first film collector 122. The second size measurement portion 224 may move above the second test table 120B. For example, the second size measurement portion 224 may move in a direction from a second film feeder 124 to a second film collector 125.

The first size measurement portion 223 may measure a size of a liquid droplet discharged on the first test table 120A, and the second size measurement portion 224 may measure a size of a liquid droplet discharged on the second test table 120B.

In an embodiment, a controller (not shown) may measure, by reflecting a surface profile of the test table, for example, the first and second test tables 120A and 120B, in a size of a liquid droplet measured by the size measurement portion, for example, the first and second size measurement portions 223 and 224, a volume of the liquid droplet. As an example, the size measurement portion, for example, the first and second size measurement portions 223 and 224, may be connected to the controller, and a size of the liquid droplet measured by the size measurement portion, for example, the first and second size measurement portions 223 and 224, may be transmitted to the controller. Accordingly, the controller may measure an accurate size of a liquid droplet discharged to or disposed on the test table, for example, the first and second test tables 120A and 120B, by reflecting a surface profile of the test table, for example, the first and second test tables 120A and 120B, measured by the profile measurement portion, for example, the first and second profile measurement portions 221 and 222, in a size of the liquid droplet.

Figure 8A:
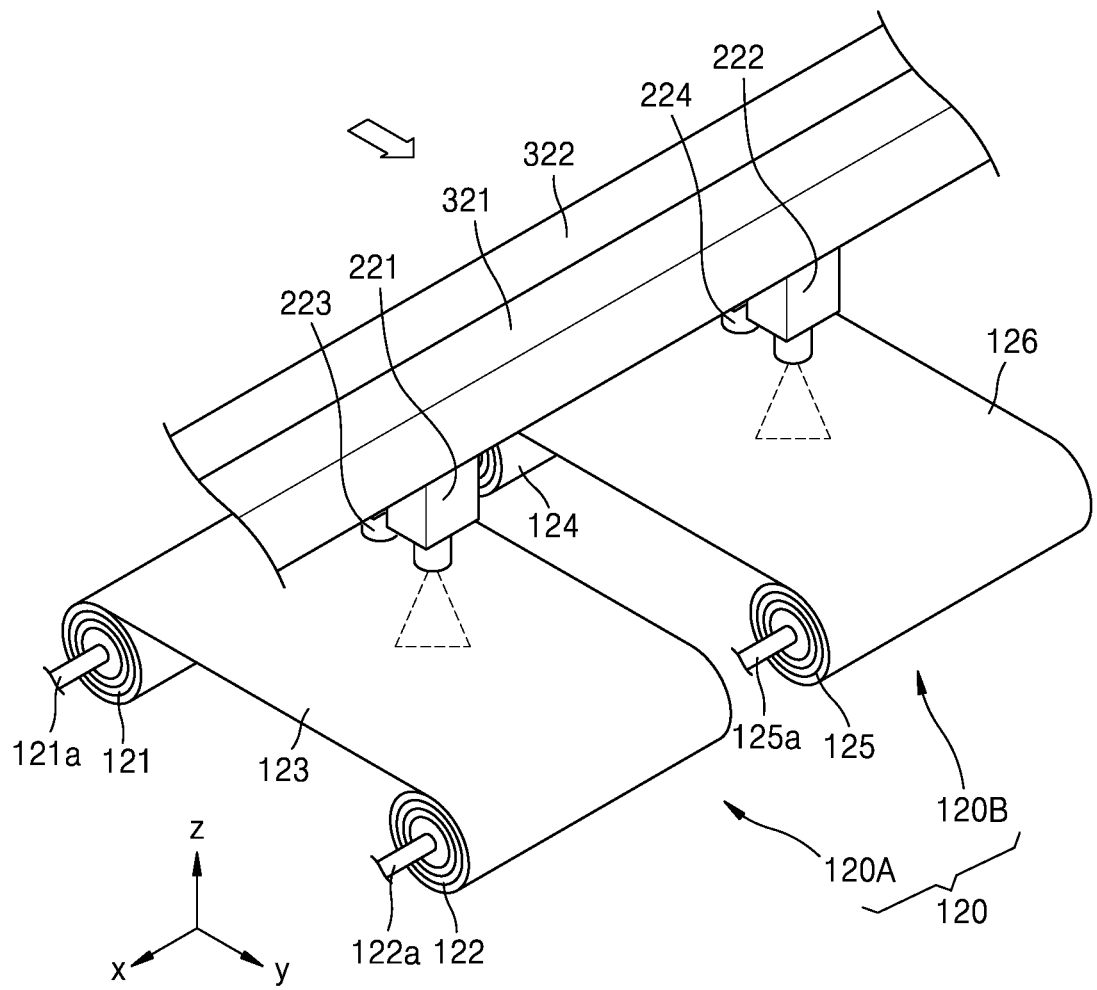
FIGS. 8A and 8B are schematic perspective views of a method of operating the liquid droplet measurement portion shown in FIG. 7, according to an embodiment.
Figure 8B:
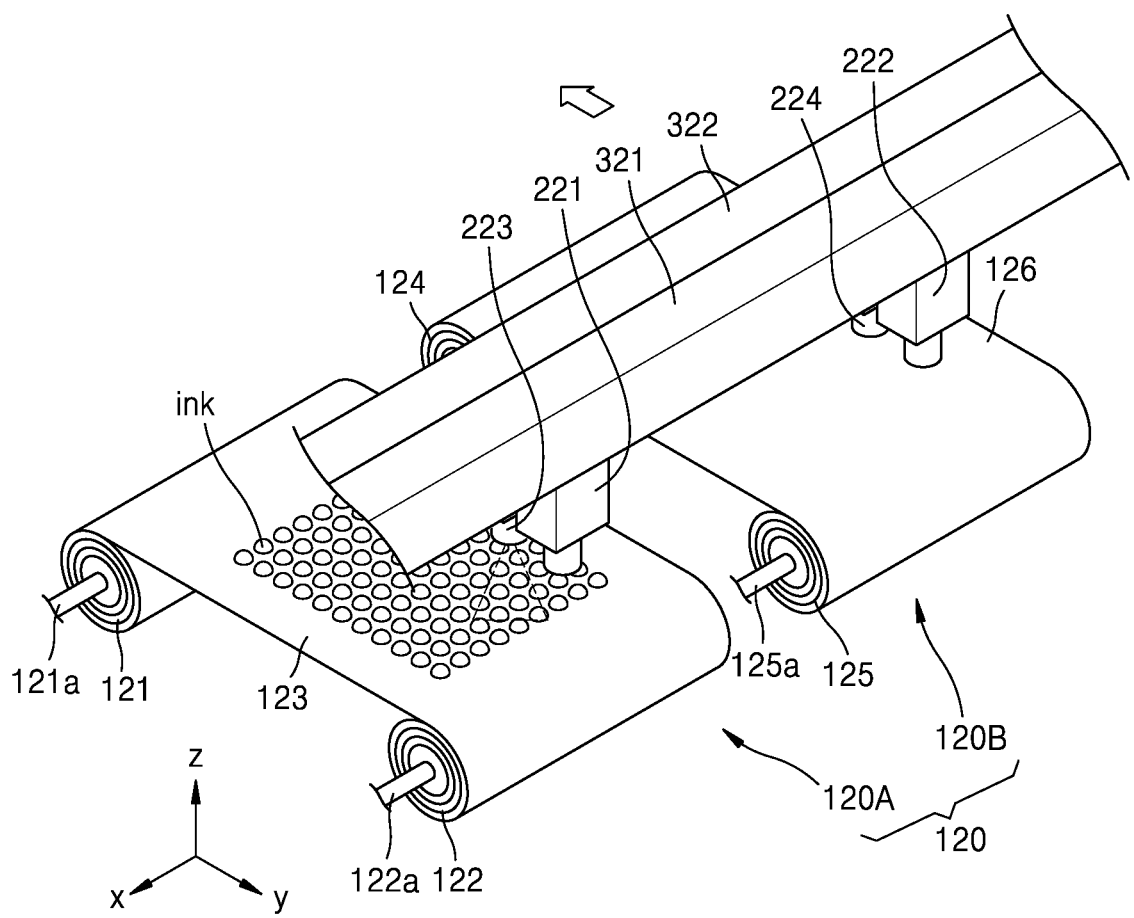
Figure 8C:
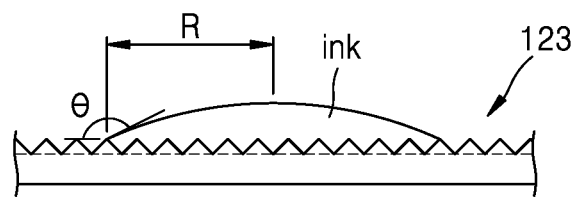
FIG. 8C is a schematic cross-sectional view of a portion of a first film shown in FIG. 8B.
Figure 8D:
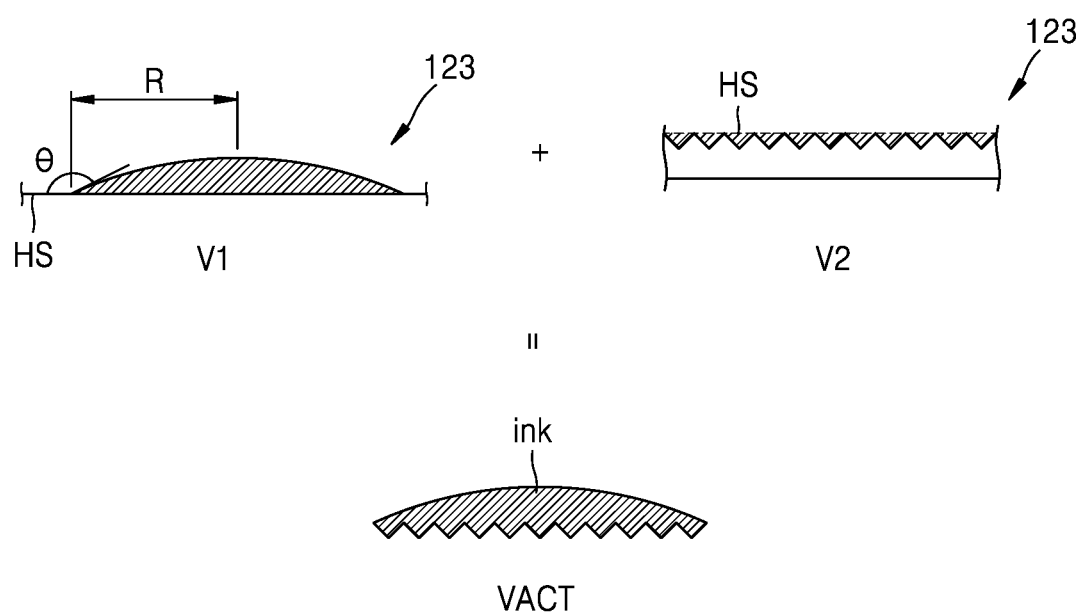
FIG. 8D is a schematic cross-sectional view showing a method of measuring the volume of a droplet.
Figure 8E:
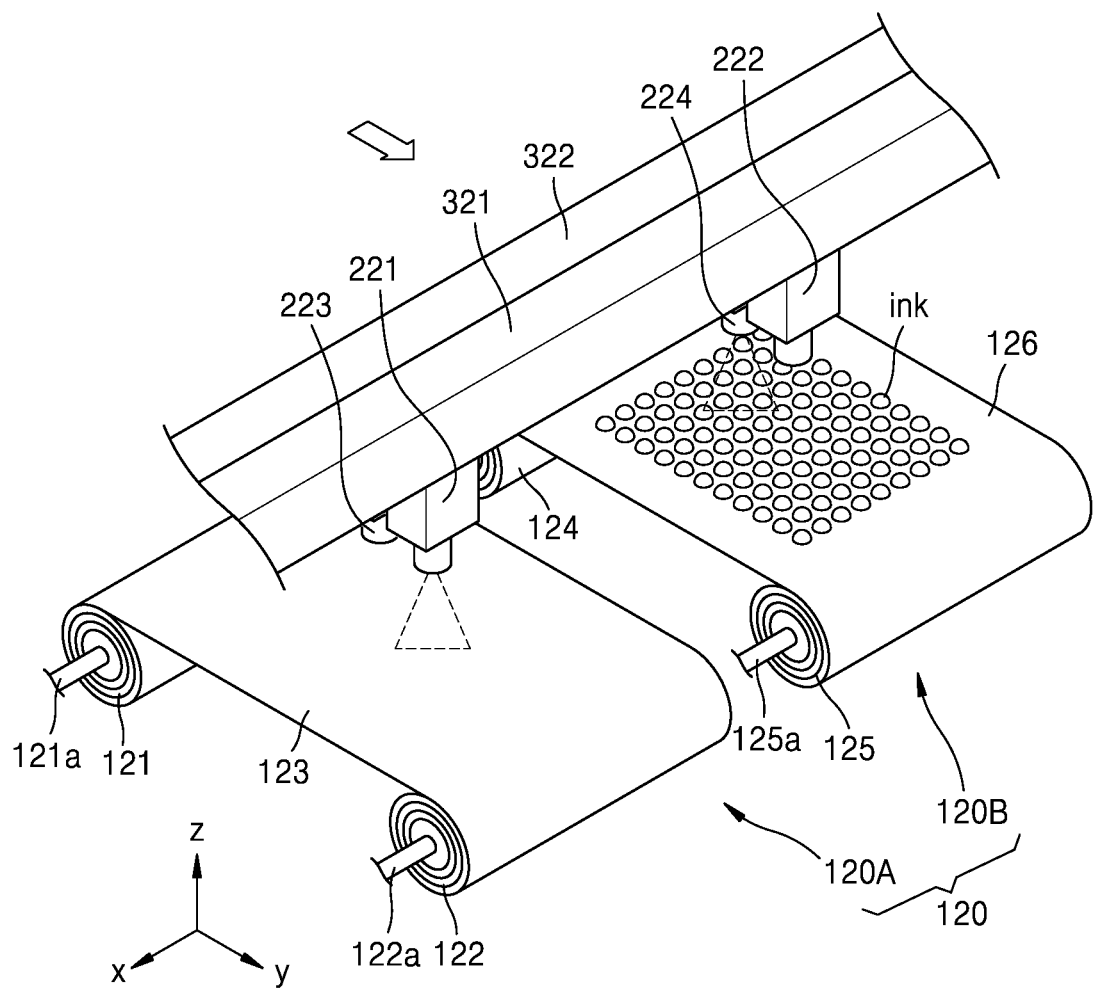
FIGS. 8E and 8F are schematic perspective views of a method of operating the liquid droplet measurement portion shown in FIG. 7, according to an embodiment.
Figure 8F:
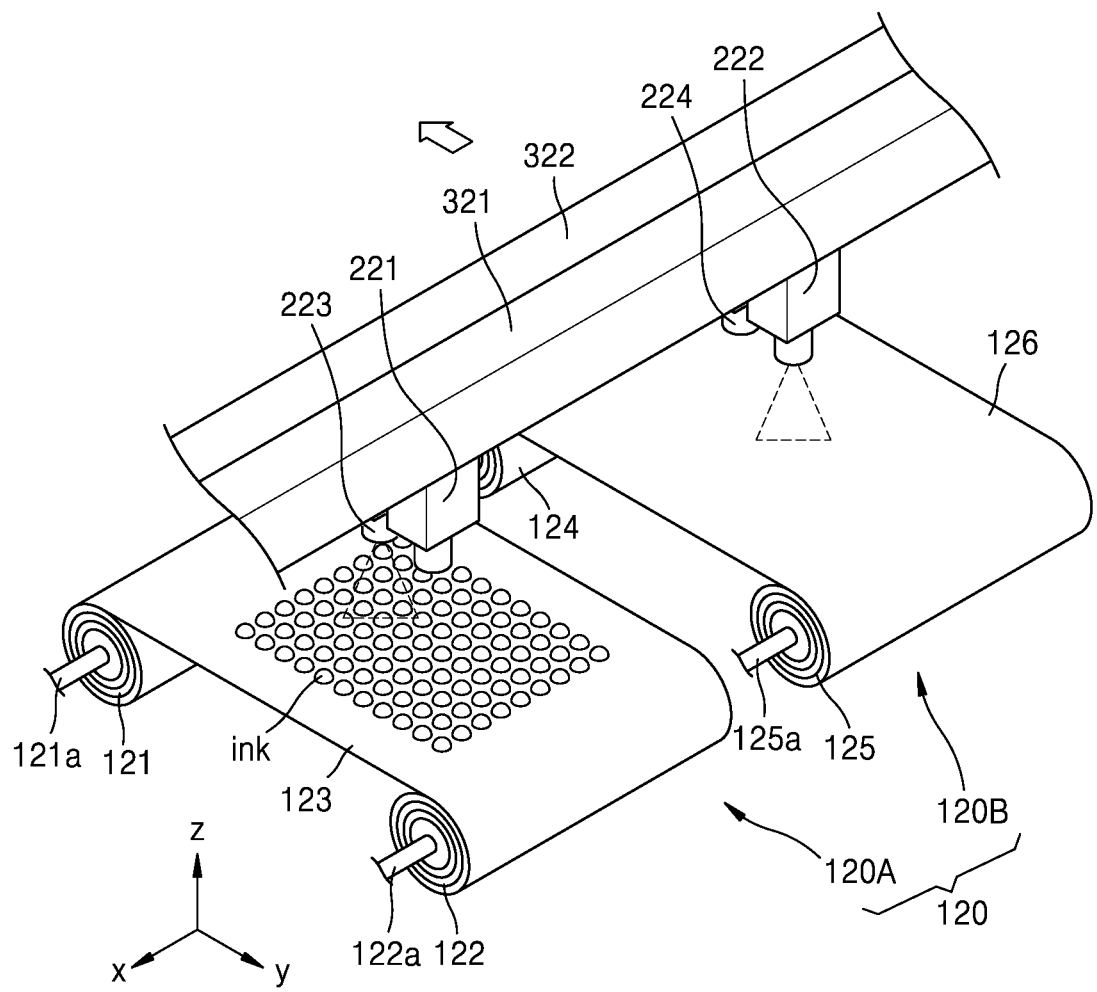

FIGS. 8A and 8B are schematic perspective views of a method of operating the liquid droplet measurement portion shown in FIG. 7, according to an embodiment. FIG. 8C is a schematic cross-sectional view of a portion of a first film 123 shown in FIG. 8B. FIG. 8D is a schematic cross-sectional view showing a method of measuring the volume of a droplet. FIGS. 8E and 8F are schematic perspective views of a method of operating the liquid droplet measurement portion shown in FIG. 7, according to an embodiment.

Referring to FIG. 8A, the first film 123 and a second film 126 may be fed. The first film 123 may be fed by the first film feeder 121, and the second film 126 may be fed by the second film feeder 124. In this regard, the first feeding axis 121a and the first collecting axis 122a may rotate, and the second feeding axis 124a and the second collecting axis 125a may rotate.

The first profile measurement portion 221 and the second profile measurement portion 222 may measure a surface profile of the first test table 120A and a surface profile of the second test table 120B, respectively.

Referring to FIGS. 8B and 8C, a liquid droplet (ink) may be discharged on the first test table 120A. In this regard, a liquid droplet discharger (not shown) may face the first test table 120A, and the liquid droplet (ink) may be discharged on the first test table 120A from the liquid droplet discharger.

A size of the liquid droplet (ink) discharged on the first test table 120A may be measured. The first size measurement portion 223 may measure a size of the liquid droplet (ink) discharged on the first test table 120A.

In this regard, measurement of a size of the liquid droplet (ink) may be defined as measurement of a radius R of the liquid droplet (ink). The size measurement portion, for example, the first and second size measurement portions 223 and 224, may obtain a two-dimensional image of an object, and in this regard, may measure the radius R of the liquid droplet (ink).

In a case that it is assumed that the liquid droplet (ink) is arranged or disposed in a shape similar to a hemisphere on the first film 123, a volume of the liquid droplet (ink) may be arithmetically obtained through a contact angle formed by surface energy between the liquid droplet (ink) and the first film 123 and the radius R measured by the first size measurement portion 223 as shown in Equation 1 below.

$$V = \frac{\pi\left(-\cos\theta + \frac{1}{3}(\cos\theta)^3 + \frac{2}{3}\right)R^3}{(\sin\theta)^3}$$

(where V denotes a volume of the liquid droplet (ink), θ denotes a contact angle, and R denotes a radius of the liquid droplet (ink) for the first film 123.)

A controller (not shown) may measure a volume of a liquid droplet discharged on the first test table 120A by reflecting a surface profile of the first test table 120A in a size of the liquid droplet discharged on the first test table 120A.

In an embodiment, measuring a surface profile of the first film 123 may be to measure an accurate volume in a case that a liquid droplet is discharged on the first film 123. Different from the embodiment, in a case that a volume of the liquid droplet (ink) is arithmetically measured through the radius R measured by the first size measurement portion 223, it may not be possible to measure an accurate volume of the liquid droplet (ink) due to a fine groove, a protrusion, or a curved degree of a surface arranged or disposed on the first film 123, and an error may occur from an actual volume of the liquid droplet. In an embodiment, a surface profile of the first film 123 may be measured, and an arithmetically measured volume of the liquid droplet (ink) may be calibrated, and thus, an accurate volume of the liquid droplet may be measured. For example, the controller may subtract a volume occupied by the protrusion from the arithmetically measured volume of the liquid droplet (ink). Alternatively, the controller may add a volume occupied by the fine groove on the first film 123 from the arithmetically measured volume of the liquid droplet (ink). In other words, the controller may compensate for discrepancies or errors obtained in measuring the volume of the liquid droplet (ink).

Referring to FIG. 8D, the first volume V1 may be arithmetically calculated according to the size of the droplet based on a horizontal surface HS including a point where the end of the droplet meets the surface of the first film 123. The second volume V2 filling the space between the surface profile of the first film 123 and the horizontal surface HS may also be calculated. For example, a plurality of grooves may be provided on the first film 123 based on the horizontal surface HS, and droplets may fill the plurality of grooves. In this case, the second volume V2 may have a positive value. In another example, a plurality of protrusions may be provided on the first film 123 based on the horizontal surface HS. In this case, the second volume V2 may have a negative value. The first volume V1 and the second volume V2 may be added to calculate the actual volume VACT of the ink. Therefore, it is possible to accurately determine the volume of the droplet.

The first film 123 may be collected to the first film collector 122. In this regard, the first feeding axis 121a and the first collecting axis 122a may rotate. Accordingly, from among the first film 123, a first film portion where a discharged liquid droplet may be arranged or disposed may be collected to the first film collector 122, and a new first film portion may be fed from the first film feeder 121.

Referring to FIG. 8E, a liquid droplet (ink) may be discharged on the second test table 120B. In this regard, the liquid droplet discharger (not shown) may face the second test table 120B, and the liquid droplet (ink) may be discharged on the second test table 120B from the liquid droplet discharger.

In a case that a surface profile of the first test table 120A is measured, a size of the liquid droplet (ink) discharged on the second test table 120B may be measured. The first profile measurement portion 221 may measure a surface profile of the first test table 120A, and at the same time, the second size measurement portion 224 may measure a size of the liquid droplet (ink) discharged on the second test table 120B.

The controller (not shown) may measure a volume of a liquid droplet discharged on the second test table 120B by reflecting a surface profile of the second test table 120B in a size of the liquid droplet discharged on the second test table 120B. A volume of a liquid droplet discharged on the second test table 120B may be obtained in a similar way to the method of measuring a volume of a liquid droplet discharged on the first test table 120A.

The second film 126 may be collected to the second film collector 125. In this regard, the second feeding axis 124a and the second collecting axis 125a may rotate. Accordingly, from among the second film 126, a second film portion where a discharged liquid droplet may be arranged or disposed may be collected to the second film collector 125, and a new second film portion may be fed from the second film feeder 124.

Also, a liquid droplet (ink) may be discharged on the first test table 120A. In this regard, the liquid droplet discharger (not shown) may face the first test table 120A, and the liquid droplet (ink) may be discharged on the first test table 120A from the liquid droplet discharger.

Next, referring to FIG. 8F, in a case that a size of the liquid droplet (ink) discharged on the first test table 120A is measured, a surface profile of the second test table 120B may be measured. The first size measurement portion 223 may measure a size of the liquid droplet (ink) discharged on the first test table 120A, and at the same time, the second profile measurement portion 222 may measure a surface profile of the second test table 120B.

The first film 123 may be collected to the first film collector 122 again, a liquid droplet (ink) may be discharged on the second test table 120B, and while a surface profile of the first test table 120A is measured, a size of the liquid droplet (ink) discharged on the second test table 120B may be measured. The above measurement process may be repeated.

As in an embodiment, while a surface profile of one from among test tables, for example, the first and second test tables 120A and 120B, is measured, a size of a liquid droplet discharged on the other from among the test tables, for example, the first and second test tables 120A and 120B, may be measured, and thus, a time required to measure a volume of liquid droplets may decrease, and productivity of an apparatus for manufacturing a display apparatus may improve.

Figure 9A:
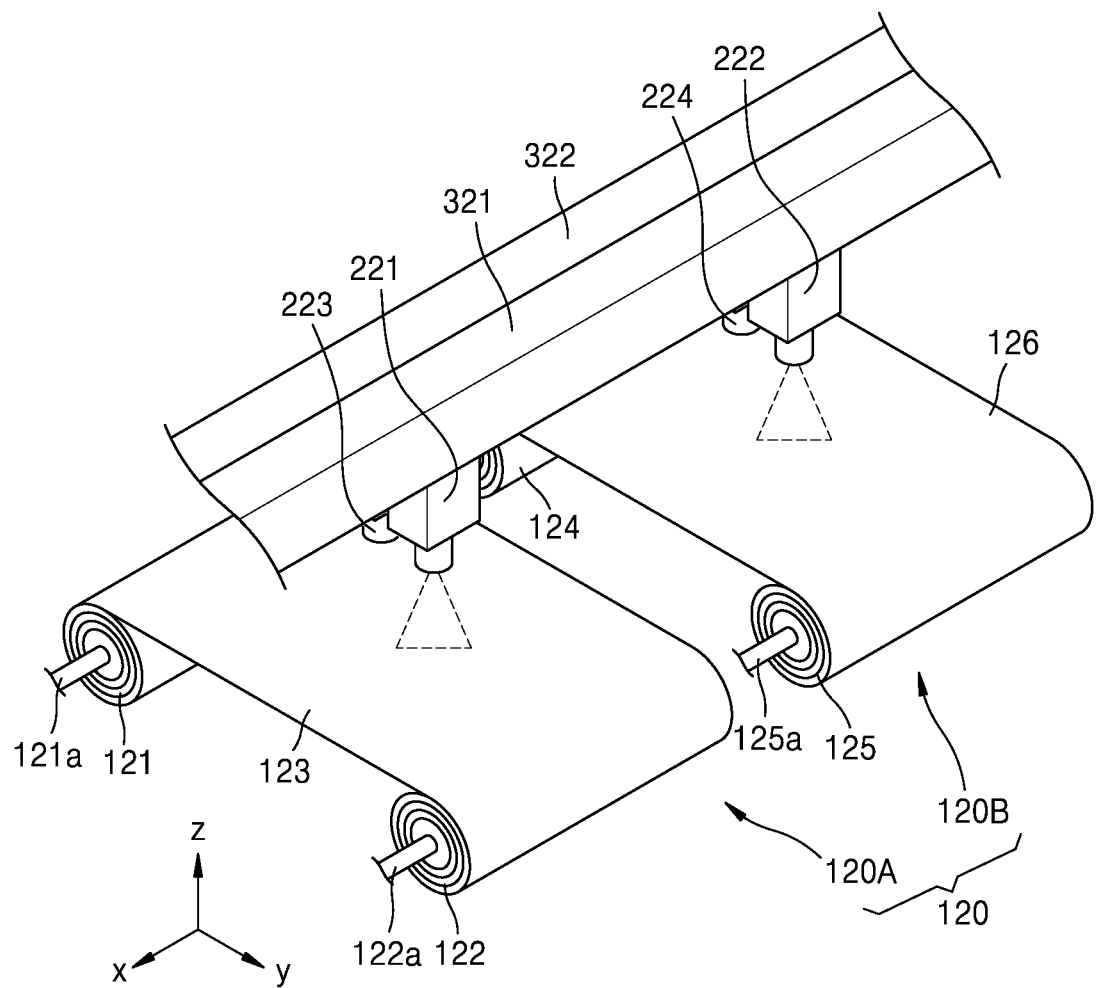
FIGS. 9A and 9B are schematic perspective views of a method of operating the liquid droplet measurement portion shown in FIG. 7, according to an embodiment.
Figure 9B:
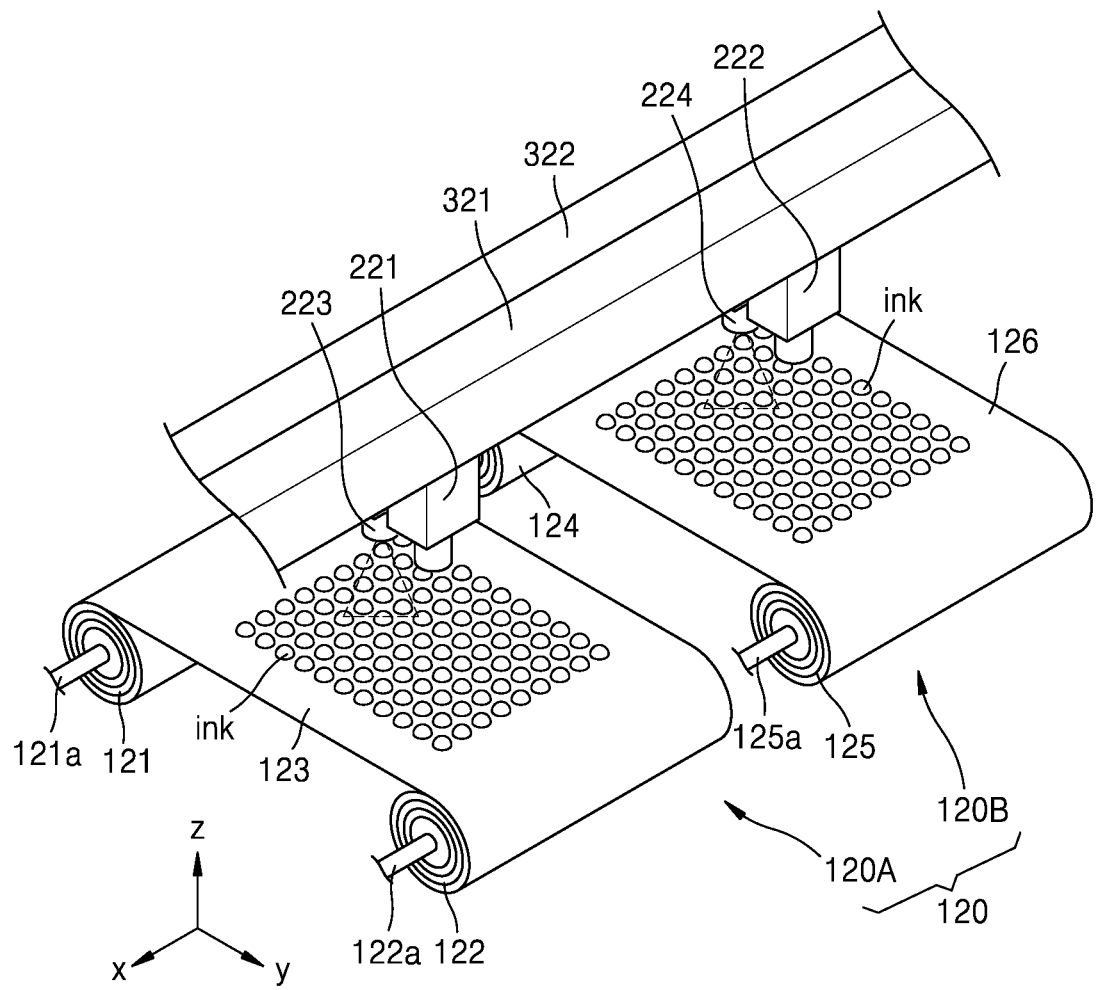

FIGS. 9A and 9B are schematic perspective views of a method of operating the liquid droplet measurement portion shown in FIG. 7, according to an embodiment.

Referring to FIG. 9A, the first film 123 and the second film 126 may be fed. The first film 123 may be fed by the first film feeder 121, and the second film 126 may be fed by the second film feeder 124. In this regard, the first feeding axis 121a and the first collecting axis 122a may rotate, and the second feeding axis 124a and the second collecting axis 125a may rotate.

A surface profile of the first test table 120A and a surface profile of the second test table 120B may be simultaneously measured. For example, the first profile measurement portion 221 and the second profile measurement portion 222 may simultaneously measure a surface profile of the first test table 120A and a surface profile of the second test table 120B, respectively.

Referring to FIG. 9B, liquid droplets (ink) may be discharged on the first test table 120A and the second test table 120B, respectively. In this regard, a liquid droplet discharger (not shown) may face the first test table 120A and the second test table 120B, and the liquid droplets (ink) may be discharged on the first test table 120A and the second test table 120B, respectively, from the liquid droplet discharger.

Sizes of the liquid droplets (ink) discharged on the first test table 120A and the second test table 120B may be simultaneously measured. In this case, the first size measurement portion 223 and the second size measurement portion 224 may simultaneously measure sizes of liquid droplets discharged on the first test table 120A and the second test table 120B, respectively.

In this regard, a controller (not shown) may measure a volume of a liquid droplet discharged on the first test table 120A by reflecting a surface profile of the first test table 120A in a size of the liquid droplet discharged on the first test table 120A. The controller (not shown) may measure a volume of a liquid droplet discharged on the second test table 120B by reflecting a surface profile of the second test table 120B in a size of the liquid droplet discharged on the second test table 120B.

The first film 123 may be collected to the first film collector 122, and the second film 126 may be collected to the second film collector 125.

A surface profile of the first test table 120A and a surface profile of the second test table 120B may be simultaneously measured again. The above measurement process may be repeated.

As in an embodiment, profile measurement portions, for example, the first and second profile measurement portions 221 and 222, and size measurement portions, for example, the first and second size measurement portions 223 and 224, may measure surface profiles of test tables, for example, the first and second test tables 120A and 120B, and sizes of liquid droplets discharged on the test tables, for example, the first and second test tables 120A and 120B, respectively, and thus, a time required to measure a volume of liquid droplets may decrease, and productivity of an apparatus for manufacturing a display apparatus may improve.

Figure 10:
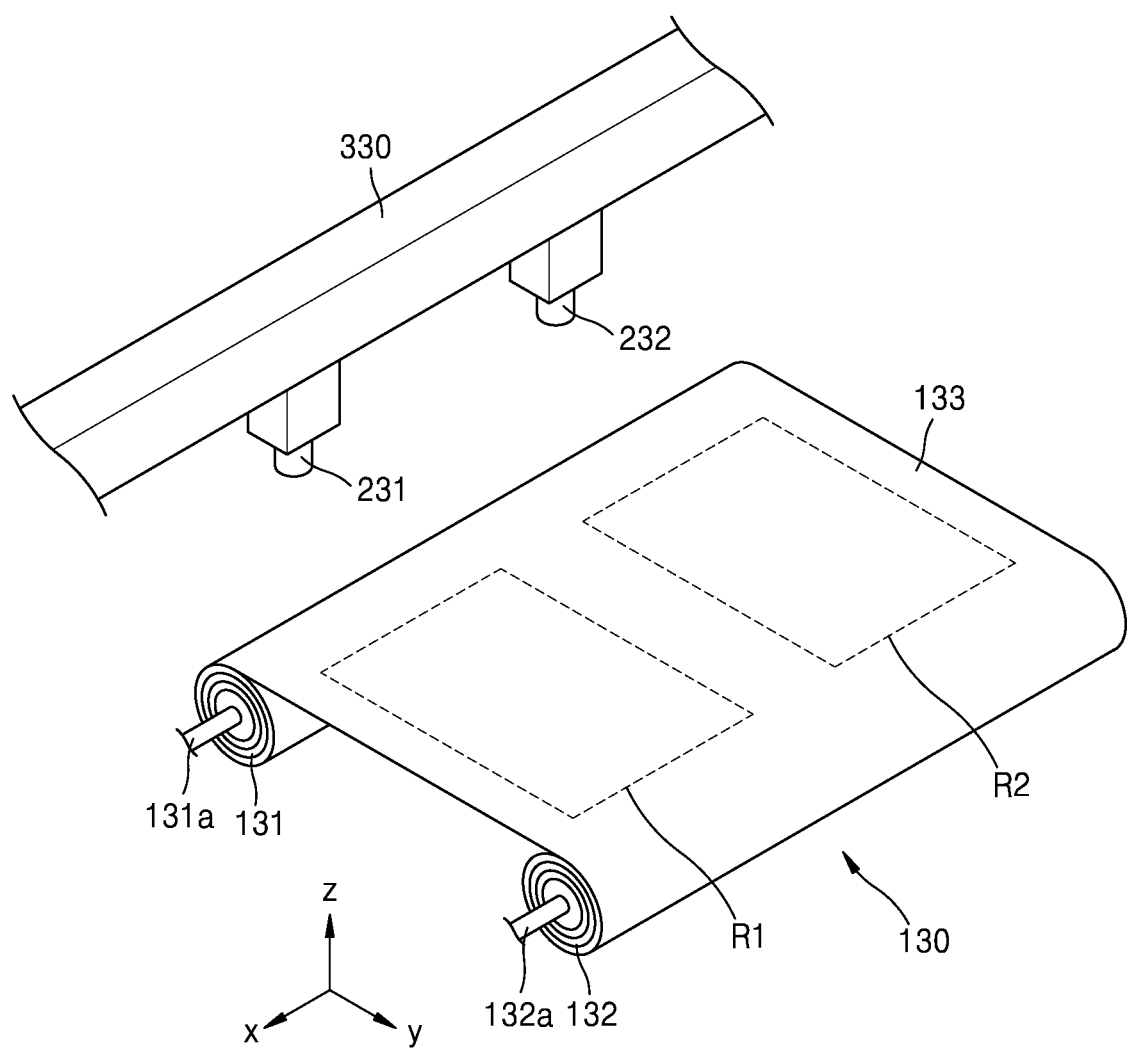
FIG. 10 is a schematic perspective view of a portion of a liquid droplet measurement portion according to an embodiment.

FIG. 10 is a schematic perspective view of a portion of a liquid droplet measurement portion according to an embodiment.

Referring to FIG. 10, the liquid droplet measurement portion may include a test table 130, a profile measurement portion, for example, first and second profile measurement portions 231 and 232, and a second gantry 330. The test table 130 of FIG. 10 may be the same as or similar to the test table 100 of FIG. 2, and thus, a detailed description thereof may be omitted. The profile measurement portion, for example, the first and second profile measurement portions 231 and 232, and the second gantry 330 of FIG. 10 may be the same as or similar to the profile measurement portion, for example, the first and second profile measurement portions 211 and 212, and the second gantry 310 of FIG. 4, and thus, a detailed description thereof may be omitted.

The test table 130 may include a first region R1 and a second region R2 spaced apart from the first region R1. In this regard, the first region R1 and the second region R2 may each be defined as a region to which a liquid droplet may be discharged.

In an embodiment, the first profile measurement portion 231 may correspond to the first region R1, and the second profile measurement portion 232 may correspond to the second region R2. The first profile measurement portion 231 may move above the first region R1. The second profile measurement portion 232 may move above the second region R2.

The first profile measurement portion 231 may measure a surface profile of the first region R1, and the second profile measurement portion 232 may measure a surface profile of the second region R2. The first profile measurement portion 231 may measure a surface profile of a liquid droplet discharged to or disposed on the first region R1, and the second profile measurement portion 232 may measure a surface profile of a liquid droplet discharged to or disposed on the second region R2.

The first profile measurement portion 231 may transmit the surface profile of the first region R1 and the surface profile of a liquid droplet discharged to or disposed on the first region R1 to a controller (not shown). The second profile measurement portion 232 may transmit the surface profile of the second region R2 and the surface profile of a liquid droplet discharged to or disposed on the second region R2 to the controller.

In an embodiment, the first profile measurement portion 231 and the second profile measurement portion 232 may measure a surface profile of liquid droplets discharged on one test table 130. Accordingly, a time required to measure a volume of liquid droplets may decrease, and productivity of an apparatus for manufacturing a display apparatus may improve.

Figure 11A:
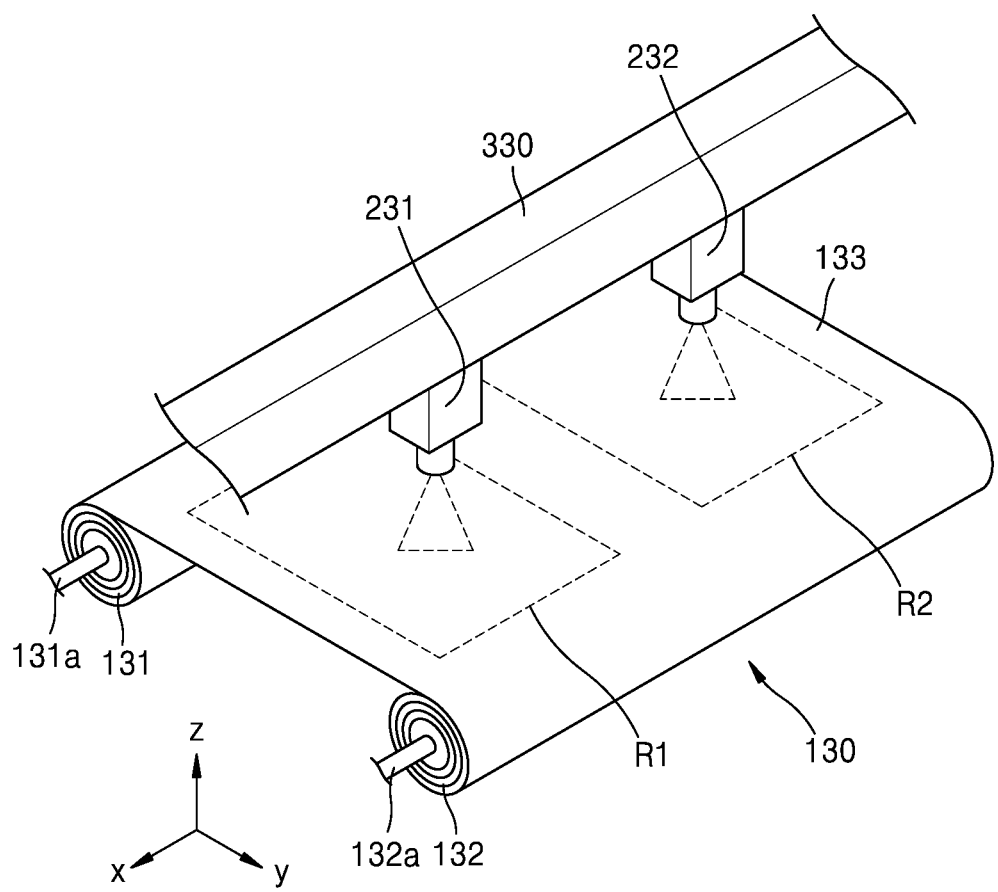
FIGS. 11A and 11B are schematic perspective views of a method of operating the liquid droplet measurement portion shown in FIG. 10.
Figure 11B:
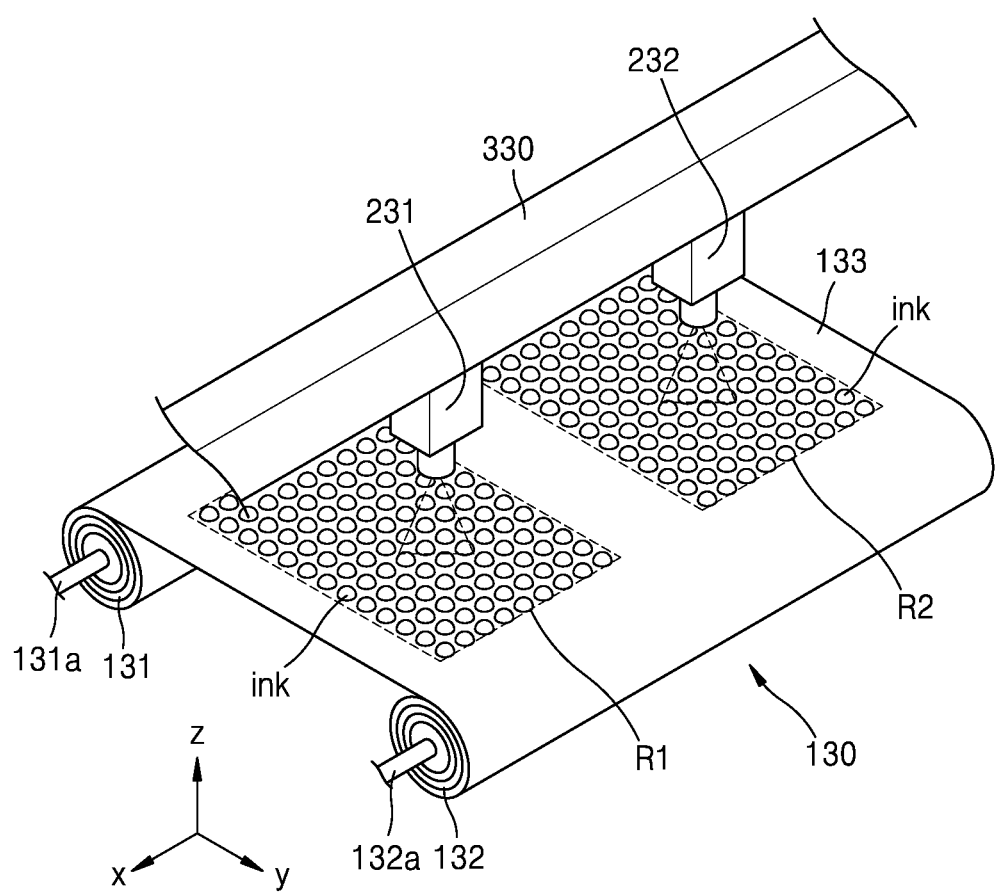

FIGS. 11A and 11B are schematic perspective views of a method of operating the liquid droplet measurement portion shown in FIG. 10.

Referring to FIG. 11A, a film 133 may be fed. The film 133 may be fed by a film feeder 131. In this regard, a first axis 131a and a second axis 132a may rotate.

A surface profile of the first region R1 and a surface profile of the second region R2 may be simultaneously measured. For example, the first profile measurement portion 231 and the second profile measurement portion 232 may simultaneously measure a surface profile of the first region R1 and a surface profile of the second region R2, respectively.

Referring to FIG. 11B, liquid droplets (ink) may be discharged on the first region R1 and the second region R2, respectively. In this regard, a liquid droplet discharger (not shown) may face the first region R1 and the second region R2, and the liquid droplets (ink) may be discharged on the first region R1 and the second region R2, respectively, from the liquid droplet discharger.

Surface profiles of the liquid droplets (ink) discharged on the first region R1 and the second region R2 may be simultaneously measured. The first profile measurement portion 231 and the second profile measurement portion 232 may simultaneously measure surface profiles of the liquid droplets (ink) discharged on the first region R1 and the second region R2, respectively.

In this regard, a controller (not shown) may measure a volume of a liquid droplet discharged on the first region R1 by reflecting a surface profile of the first region R1 in a surface profile of the liquid droplet discharged on the first region R1. The controller (not shown) may measure a volume of a liquid droplet discharged on the second region R2 by reflecting a surface profile of the second region R2 in a surface profile of the liquid droplet discharged on the second region R2.

The film 133 may be collected to the film collector 132.

A surface profile of the first region R1 and a surface profile of the second region R2 may be simultaneously measured again. The above measurement process may be repeated.

As in an embodiment, profile measurement portions, for example, the first and second profile measurement portions 231 and 232, may measure a surface profile of the first region R1 and a surface profile of the second region R2, and a surface profile of a liquid droplet discharged on the first region R1 and a surface profile of a liquid droplet discharged on the second region R2, and thus, a time required to measure a volume of liquid droplets may decrease, and productivity of an apparatus for manufacturing a display apparatus may improve.

Figure 12:
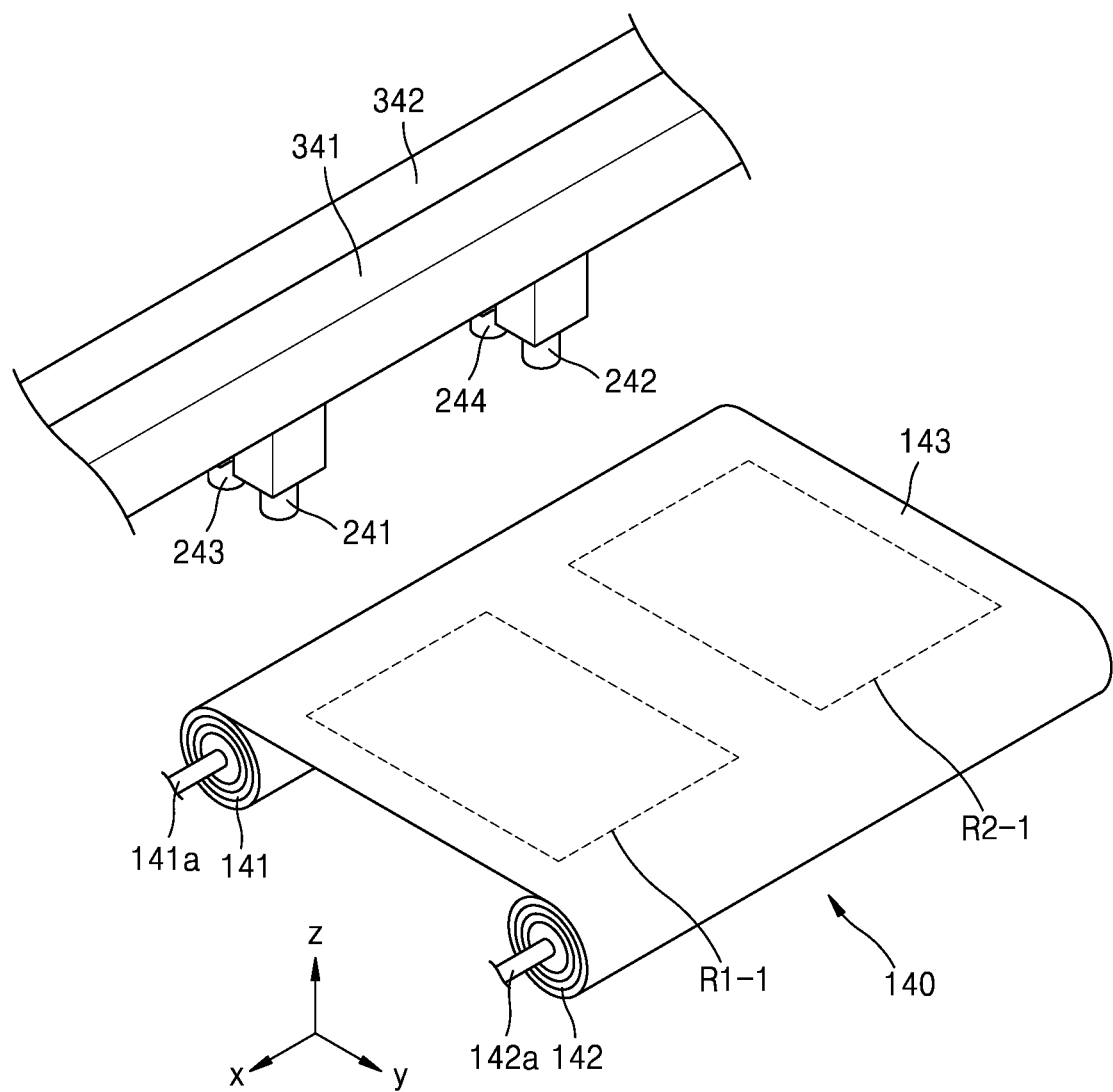
FIG. 12 is a schematic perspective view of a portion of a liquid droplet measurement portion according to an embodiment.

FIG. 12 is a schematic perspective view of a portion of a liquid droplet measurement portion according to an embodiment.

Referring to FIG. 12, the liquid droplet measurement portion may include a test table 140, a profile measurement portion, for example, first and second profile measurement portions 241 and 242, a size measurement portion, for example, first and second size measurement portions 243 and 244, a second gantry 341, and a third gantry 342. The test table 140 may include a first region R1-1 and a second region R2-1. The test table 140, the profile measurement portion, for example, the first and second profile measurement portions 241 and 242, the second gantry 341, the first region R1-1, and the second region R2-1 of FIG. 12 may be the same as or similar to the test table 130, the profile measurement portion, for example, the first and second profile measurement portions 231 and 232, the second gantry 330, the first region R1, and the second region R2 of FIG. 10, and thus, a detailed description thereof may be omitted. The size measurement portion, for example, the first and second size measurement portions 243 and 244, and the third gantry 342 of FIG. 12 may be the same as or similar to the size measurement portion, for example, the first and second size measurement portions 223 and 224, and the third gantry 322 of FIG. 7, and thus, a detailed description thereof may be omitted.

In an embodiment, the first size measurement portion 243 may correspond to the first region R1-1, and the second size measurement portion 244 may correspond to the second region R2-1. The first size measurement portion 243 may move above the first region R1-1. The second size measurement portion 244 may move above the second region R2-1.

The first size measurement portion 243 may measure a size of a liquid droplet discharged to or disposed on the first region R1-1, and the second size measurement portion 244 may measure a size of a liquid droplet discharged to or disposed on the second region R2-1.

The first size measurement portion 243 may transmit the size of a liquid droplet discharged to or disposed on the first region R1-1 to a controller (not shown). The second size measurement portion 244 may transmit the size of a liquid droplet discharged to or disposed on the second region R2-1 to the controller.

In an embodiment, the first size measurement portion 243 and the second size measurement portion 244 may measure a size of liquid droplets discharged to or disposed on one test table 140. Accordingly, a time required to measure a volume of liquid droplets may decrease, and productivity of an apparatus for manufacturing a display apparatus may improve.

Figure 13A:
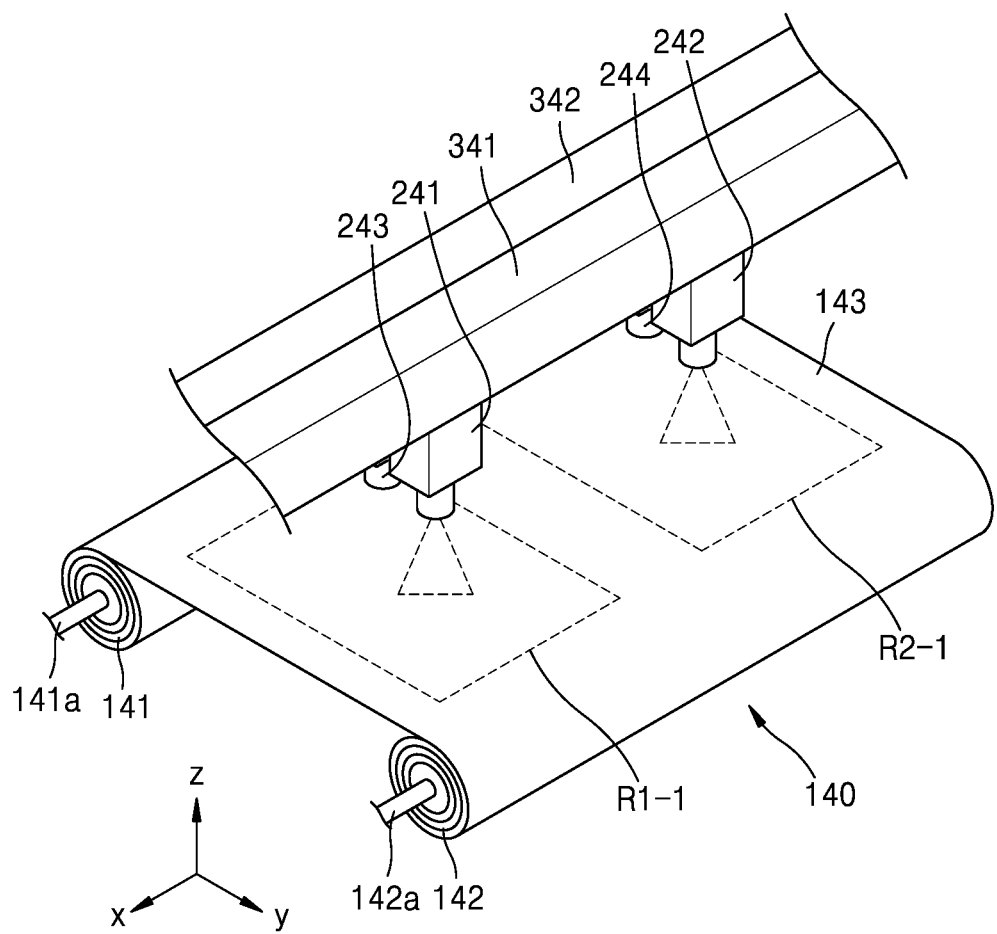
FIGS. 13A and 13B are schematic perspective views of a method of operating the liquid droplet measurement portion shown in FIG. 12.
Figure 13B:
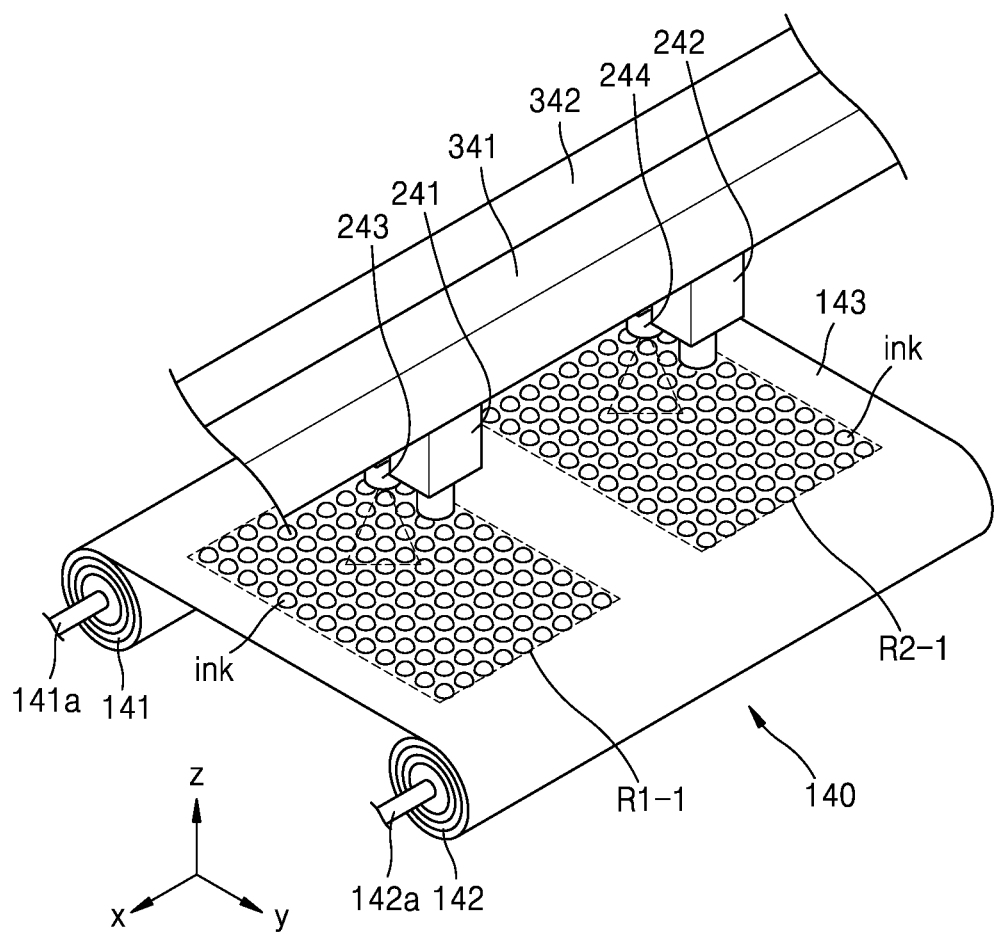

FIGS. 13A and 13B are schematic perspective views of a method of operating the liquid droplet measurement portion shown in FIG. 12.

Referring to FIG. 13A, a film 143 may be fed. The film 143 may be fed by a film feeder 141. In this regard, a first axis 141a and a second axis 142a may rotate.

A surface profile of the first region R1-1 and a surface profile of the second region R2-1 may be simultaneously measured. For example, the first profile measurement portion 241 and the second profile measurement portion 242 may simultaneously measure a surface profile of the first region R1-1 and a surface profile of the second region R2-1, respectively.

Referring to FIG. 13B, liquid droplets (ink) may be discharged on the first region R1-1 and the second region R2-1, respectively. In this regard, a liquid droplet discharger (not shown) may face the first region R1-1 and the second region R2-1, and the liquid droplets (ink) may be discharged on the first region R1-1 and the second region R2-1, respectively, from the liquid droplet discharger.

A size of a liquid droplet discharged to or disposed on the first region R1-1 and a size of a liquid droplet discharged to or disposed on the second region R2-1 may be simultaneously measured. For example, the first size measurement portion 243 and the second size measurement portion 244 may simultaneously measure a size of a liquid droplet discharged to or disposed on the first region R1-1 and a size of a liquid droplet discharged to or disposed on the second region R2-1, respectively.

In this regard, a controller (not shown) may measure a volume of a liquid droplet discharged on the first region R1-1 by reflecting a surface profile of the first region R1-1 in a size of the liquid droplet discharged on the first region R1-1. The controller (not shown) may measure a volume of a liquid droplet discharged on the second region R2-1 by reflecting a surface profile of the second region R2-1 in a size of the liquid droplet discharged on the second region R2-1.

The film 143 may be collected to the film collector 142.

A surface profile of the first region R1-1 and a surface profile of the second region R2-1 may be simultaneously measured again. The above measurement process may be repeated.

As in an embodiment, profile measurement portions, for example, the first and second profile measurement portions 241 and 242, may measure a surface profile of the first region R1-1 and a surface profile of the second region R2-1, and size measurement portions, for example, the first and second size measurement portions 243 and 244, may measure a size of a liquid droplet discharged to or disposed on the first region R1-1 and a size of a liquid droplet discharged to or disposed on the second region R2-1, and thus, a time required to measure a volume of liquid droplets may decrease, and productivity of an apparatus for manufacturing a display apparatus may improve.

Hereinafter, a display apparatus manufactured by using the above apparatus for manufacturing a display apparatus will be described in detail.

Figure 14:
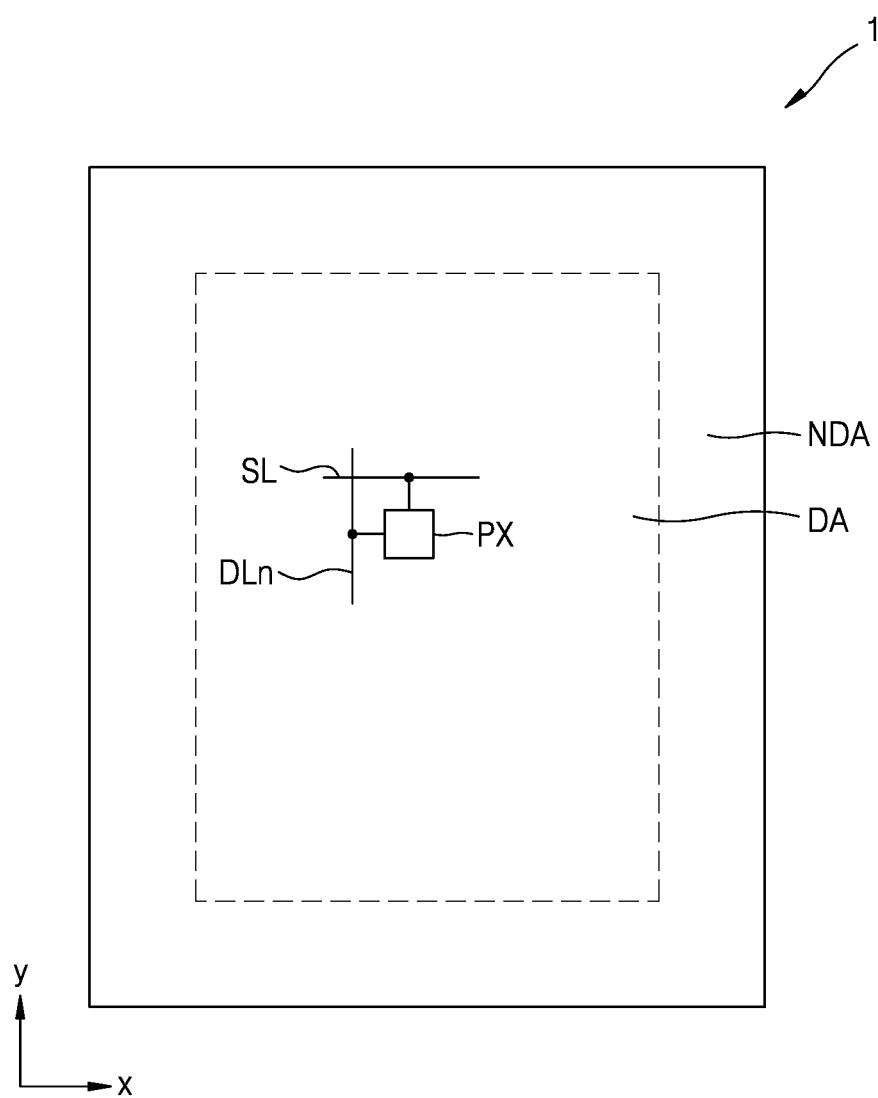
FIG. 14 is a schematic plan view of a display apparatus manufactured by an apparatus for manufacturing a display apparatus, according to an embodiment.

FIG. 14 is a schematic plan view of a display apparatus 1 manufactured by an apparatus for manufacturing a display apparatus, according to an embodiment.

Referring to FIG. 14, the display apparatus 1 may include a display area DA where an image may be implemented or displayed and a non-display area NDA where no image may be implemented or displayed. The display apparatus 1 may provide an image by using light emitted from pixels PX arranged or disposed in the display area DA. Each pixel PX may emit red, green, blue, or white light.

The display apparatus 1, which may be an apparatus that may display an image, may be a portable mobile device such as a game console, a multimedia device, or a miniature personal computer (PC). Examples of the display apparatus 1 described below may include a liquid crystal display apparatus, an electrophoretic display apparatus, an organic light-emitting display apparatus, an inorganic light-emitting display apparatus, a field emission display apparatus, a surface-conduction electron-emitter display apparatus, a quantum dot display apparatus, a plasma display apparatus, a cathode ray tube display apparatus, for example, but the disclosure is not limited thereto. Hereinafter, an organic light-emitting display apparatus will be described as an example of the display apparatus 1 manufactured via an apparatus for manufacturing a display apparatus, according to an embodiment. However, embodiments described herein may be used to manufacture various types of display apparatuses described above.

A pixel PX may be electrically connected to each of a scan line SL and a data line DLn. The scan line SL may extend in a direction x, and the data line DLn may extend in a direction y.

Figure 15:
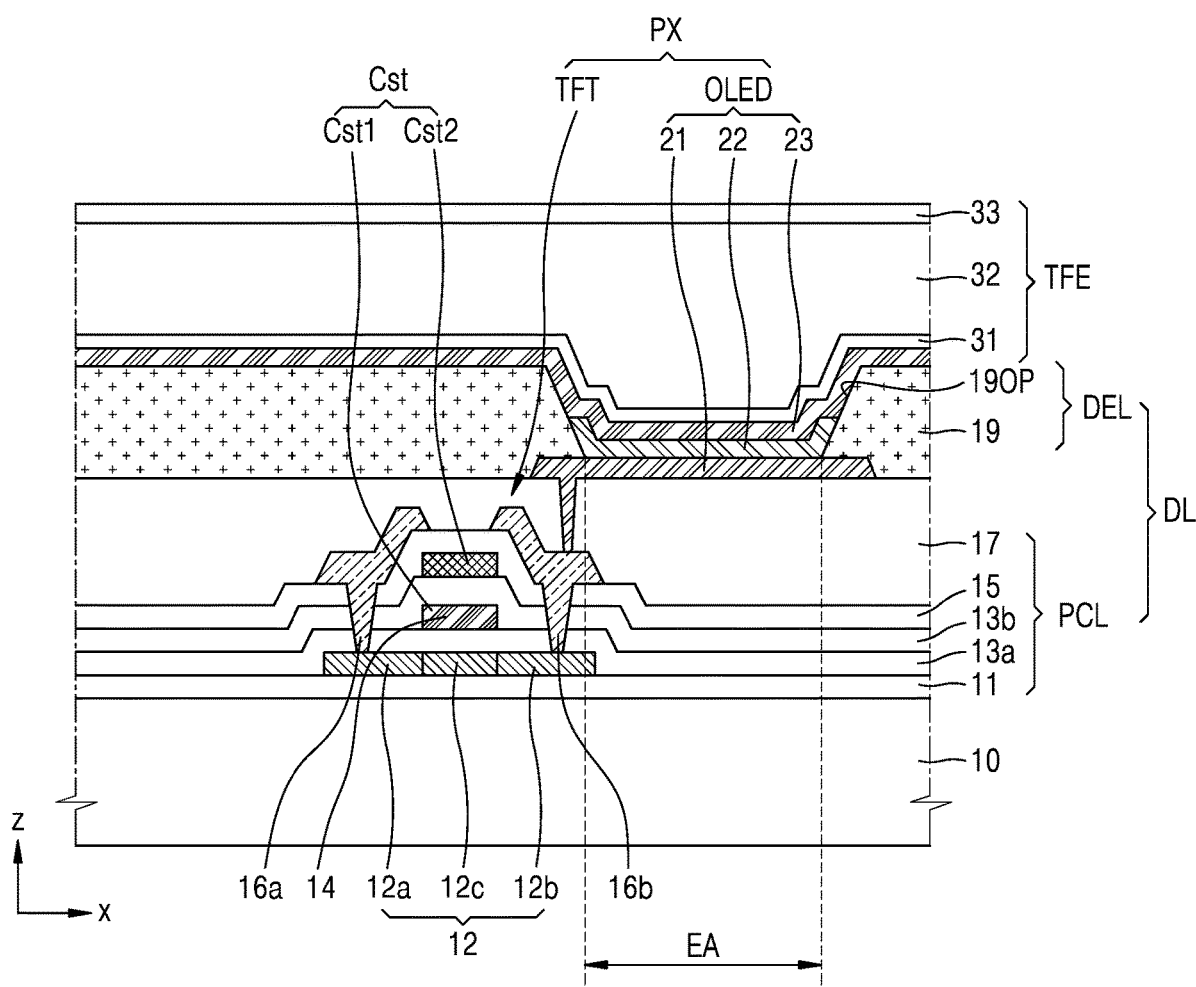
FIG. 15 is a schematic cross-sectional view of a display apparatus manufactured by an apparatus for manufacturing a display apparatus, according to an embodiment.

FIG. 15 is a schematic cross-sectional view of a display apparatus manufactured by an apparatus for manufacturing a display apparatus, according to an embodiment.

Referring to FIG. 15, a display layer DL and a thin film encapsulation layer TFE may be arranged or disposed on a substrate 10. The display layer DL may include a pixel circuit layer PCL and a display element layer DEL.

The substrate 10 may include glass or polymer resin such as polyethersulfone, polyarylate, polyetherimide, polyethylene naphthalate, polyethylene terephthalate, polyphenylene sulfide, polyimide, PC, TAC, cellulose acetate propionate, for example.

A barrier layer (not shown) may be included between the display layer DL and the substrate 10. The barrier layer, which may be a barrier layer that may prevent penetration of an external foreign material, may have a single-layer or multilayer structure including an inorganic material such as silicon nitride ($SiN_x$, $x>0$), or silicon oxide ($SiO_x$, $x>0$).

The pixel circuit layer PCL may be arranged or disposed on the substrate 10. FIG. 15 shows the pixel circuit layer PCL including a thin film transistor TFT and a buffer layer 11, a first gate insulating layer 13a, a second gate insulating layer 13b, an interlayer insulating layer 15, and a planarization insulating layer 17 arranged or disposed under or below and/or on components of the thin film transistor TFT.

The buffer layer 11 may include an inorganic insulating material such as silicon nitride, silicon oxynitride, and silicon oxide, and may have a single-layer or multilayer structure including the above inorganic insulating material.

The thin film transistor TFT may include a semiconductor layer 12, and the semiconductor layer 12 may include polysilicon. Alternatively, the semiconductor layer 12 may include amorphous silicon, may include an oxide semiconductor, or may include an organic semiconductor. The semiconductor layer 12 may include a channel region 12c and a drain region 12a and a source region 12b respectively arranged or disposed on both sides of the channel region 12c. A gate electrode 14 may overlap the channel region 12c.

The gate electrode 14 may include a low-resistance metal material. The gate electrode 14 may include a conductive material including molybdenum (Mo), aluminum (Al), copper (Cu), titanium (Ti), for example, and may have a multilayer or single-layer structure including the above material.

The first gate insulating layer 13a between the semiconductor layer 12 and the gate electrode 14 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second gate insulating layer 13b may cover or overlap the gate electrode 14. In a similar way to the first gate insulating layer 13a, the second gate insulating layer 13b may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

An upper electrode Cst2 of a storage capacitor Cst may be arranged or disposed on the second gate insulating layer 13b. The upper electrode Cst2 may overlap the gate electrode 14 below the upper electrode Cst2. In this regard, the gate electrode 14 and the upper electrode Cst2 overlapping each other with the second gate insulating layer 13b therebetween may form the storage capacitor Cst. For example, the gate electrode 14 may serve as a lower electrode Cst1 of the storage capacitor Cst.

As described above, the storage capacitor Cst and the thin film transistor TFT may overlap each other. In an embodiment, the storage capacitor Cst may not overlap the thin film transistor TFT.

The upper electrode Cst2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W) and/or copper (Cu) and may have a single-layer or multilayer structure including the above material.

The interlayer insulating layer 15 may cover or overlap the upper electrode Cst2. The interlayer insulating layer 15 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 15 may have a single-layer or multilayer structure including the above inorganic insulating material.

The drain electrode 16a and the source electrode 16b may each be located or disposed on the interlayer insulating layer 15. The drain electrode 16a and the source electrode 16b may include a highly conductive material. The drain electrode 16a and the source electrode 16b may include a conductive material including molybdenum (Mo), aluminum (Al), copper (Cu), titanium (Ti), for example, and may have a multilayer or single-layer structure including the above material. In an embodiment, the drain electrode 16a and the source electrode 16b may have a multilayer structure of Ti/Al/Ti.

The planarization insulating layer 17 may include an organic insulating layer. The planarization insulating layer 17 may include an organic insulating material such as a general commercial polymer such as poly(methyl methacrylate) (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a blend thereof.

The display element layer DEL may be arranged or disposed on the pixel circuit layer PCL having the above structure. The display element layer DEL may include an organic light-emitting diode OLED, and a pixel electrode 21 of the organic light-emitting diode OLED may be electrically connected to the thin film transistor TFT via a contact hole in the planarization insulating layer 17.

The pixel PX may include the organic light-emitting diode OLED and the thin film transistor TFT. Each pixel PX may emit, for example, red, green, or blue light, or red, green, blue, or white light, via the organic light-emitting diode OLED.

The pixel electrode 21 may include conductive oxide such as indium tin oxide (ITO), indium zinc oxide (IZO), zinc oxide (ZnO), indium oxide (In$_2$O$_3$), indium gallium oxide (IGO), or aluminum zinc oxide (AZO). In an embodiment, the pixel electrode 21 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In an embodiment, the pixel electrode 21 may further include a film including ITO, IZO, ZnO, or In$_2$O$_3$ on/under or below the above reflective film.

A pixel-defining layer 19 including an opening 190P exposing a center portion of the pixel electrode 21 may be arranged or disposed on the pixel electrode 21. The pixel-defining layer 19 may include an organic insulating material and/or an inorganic insulating material. The opening 190P may define an emission area of light emitted from the organic light-emitting diode OLED (hereinafter referred to as an emission area EA). For example, a width of the opening 190P may correspond to that of the emission area EA.

An emission layer 22 may be arranged or disposed in the opening 190P of the pixel-defining layer 19. The emission layer 22 may include a polymer or low-molecular weight organic material emitting light of a certain or predetermined color. The emission layer 22 may be formed by discharging liquid droplets with an apparatus for manufacturing a display apparatus, according to one or more embodiments.

Although not shown, a first functional layer and a second functional layer may be arranged or disposed under or below and on the emission layer 22, respectively. The first functional layer may include, for example, a hole transport layer (HTL), or an HTL and a hole injection layer (HIL). The second functional layer may be a component arranged or disposed on the emission layer 22 and may be optional. The second functional layer may include an electron transport layer (ETL) and/or an electron injection layer (EIL). The first functional layer and/or the second functional layer may be a common layer entirely covering or overlapping the substrate 10 as a common electrode 23 described below.

The common electrode 23 may include a conductive material having a low work function. For example, the common electrode 23 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the common electrode 23 may include a layer such as ITO, IZO, ZnO, or In$_2$O$_3$ on a (semi)transparent layer including the above material.

In an embodiment, the thin film encapsulation layer TFE may include at least one inorganic encapsulation layer and at least one organic encapsulation layer, and as an embodiment, FIG. 15 shows the thin film encapsulation layer TFE including a first inorganic encapsulation layer 31, an organic encapsulation layer 32, and a second inorganic encapsulation layer 33 sequentially stacked on one another.

The first inorganic encapsulation layer 31 and the second inorganic encapsulation layer 33 may include one or more inorganic materials from among aluminum oxide, titanium oxide, tantalum oxide, hafnium oxide, zinc oxide, silicon oxide, silicon nitride, and silicon oxynitride. The organic encapsulation layer 32 may include a polymer-based material. Examples of the polymer-based material may include acryl-based resin, epoxy-based resin, polyimide, and polyethylene. In an embodiment, the organic encapsulation layer 32 may include acrylate.

In an embodiment, the thin film encapsulation layer TFE may have a structure in which the substrate 10 and an upper substrate, which may be a transparent member, may be combined to each other via a sealing member to seal an inner space between the substrate 10 and the upper substrate. In this regard, a desiccant or a filler may be located or disposed in the inner space. The sealing member may be a sealant, and in an embodiment, the sealing member may include a material that may be cured by laser. For example, the sealing member may be a frit. As an example, the sealing member may include urethane-based resin, epoxy-based resin, or acryl-based resin, which may be an organic sealant, or silicone, which may be an inorganic sealant. Examples of the urethane-based resin may include urethane acrylates. Examples of the acryl-based resin may include butyl acrylate, ethylhexyl acrylate, etc, within the spirit and the scope of the disclosure. The sealing member may include a material that may be cured by heat.

A touch electrode layer (not shown) including touch electrodes may be arranged or disposed on the thin film encapsulation layer TFE, and an optical function layer (not shown) may be arranged or disposed on the touch electrode layer. The touch electrode layer may obtain coordinate information according to an external input, for example, a touch event. The optical function layer may reduce reflectance of light (external light) incident from the outside toward the display apparatus 1 and/or may improve color purity of light emitted from the display apparatus 1. In an embodiment, the optical function layer may include a phase retarder and a polarizer. The phase retarder may be a film type or a liquid crystal coating type and may include a λ/2 phase retarder and/or a λ/4 phase retarder. The polarizer may also be a film type or a liquid crystal coating type. The film type may include an elongation-type synthetic resin film, and the liquid crystal coating type may include liquid crystals in a certain or predetermined arrangement. The phase retarder and the polarizer may include a protective film.

In an embodiment, the optical function layer may include a black matrix and/or color filters. The color filters may be arranged or disposed by taking into account a color of light emitted from each pixel of the display apparatus 1. Each of the color filters may include a red, green, or blue pigment or dye. Alternatively, each of the color filters may include a quantum dot in addition to the above pigment or dye. Alternatively, some or a predetermined number of the color filters may not include the above pigment or dye and may include scattered particles such as titanium oxide. The above color filters may be formed by discharging droplets with an apparatus for manufacturing a display apparatus, according to one or more embodiments.

In an embodiment, the optical function layer may include a destructive interference structure. The destructive interference structure may include a first reflective layer and a second reflective layer arranged or disposed on different layers from each other. First reflected light and second reflected light reflected from the first reflective layer and the second reflective layer, respectively, may be subject to destructive interference, and accordingly, external light reflectance may decrease.

An adhesive member may be arranged or disposed between the touch electrode layer and the optical function layer. As the adhesive member, a general adhesive member may be employed without limitation. The adhesive member may be a pressure sensitive adhesive (PSA).

As described above, according to one or more embodiments, a volume of a liquid droplet may be measured precisely by reflecting a surface profile of at least one test table.

According to one or more embodiments, precision of an apparatus for manufacturing a display apparatus may improve. In addition, efficiency of an apparatus for manufacturing a display apparatus may improve.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An apparatus for manufacturing a display apparatus, the apparatus comprising:
   at least one test table on which a droplet is disposed;
   at least one profile measurement portion disposed adjacent to the at least one test table to measure a surface profile of the at least one test table and a surface profile of the droplet disposed on the at least one test table; and
   a controller electrically connected to the at least one profile measurement portion to measure a volume of the droplet from a difference between the surface profile of the at least one test table and the surface profile of the droplet disposed on the at least one test table.

2. The apparatus of claim 1, wherein
   the at least one profile measurement portion comprises a first profile measurement portion and a second profile measurement portion,
   the at least one test table comprises a first test table and a second test table,
   the first profile measurement portion measures a surface profile of the first test table, and
   the second profile measurement portion measures a surface profile of the second test table.

3. The apparatus of claim 1, wherein
   the at least one profile measurement portion comprises a first profile measurement portion and a second profile measurement portion,
   the first profile measurement portion measures a surface profile of a first region of the at least one test table, and
   the second profile measurement portion measures a surface profile of a second region of the at least one test table.

4. The apparatus of claim 1, wherein the at least one test table comprises:
   a film feeder that feeds a film on which the droplet is disposed; and
   a film collector that collects the film.

5. The apparatus of claim 1, further comprising:
   a droplet discharger that includes a nozzle head and discharges the droplet to the at least one test table.

6. A method of measuring a droplet, the method comprising:
   measuring a surface profile of at least one test table;
   disposing a droplet on the at least one test table;
   measuring a surface profile of the droplet disposed on the at least one test table; and
   measuring a volume of the droplet from a difference between the surface profile of the at least one test table and the surface profile of the droplet disposed on the at least one test table.

7. The method of claim 6, wherein
   the at least one test table comprises a first test table and a second test table, and
   a surface profile of a droplet disposed on the second test table is measured when measuring a surface profile of the first test table.

8. The method of claim 6, wherein
   the at least one test table comprises a first test table and a second test table, and
   a surface profile of the first test table and a surface profile of the second test table are simultaneously measured.

9. The method of claim 6, wherein the measuring of the surface profile comprises:
   measuring a surface profile of a first region of the at least one test table; and
   measuring a surface profile of a second region of the at least one test table.

10. The method of claim 6, wherein the disposing of the droplet on the at least one test table comprises:
    discharging the droplet to a film of the at least one test table; and
    collecting the film.

11. A method of manufacturing a display apparatus, the method comprising:
    measuring a surface profile of at least one test table;
    disposing a droplet on the at least one test table;
    measuring a surface profile of the droplet disposed on the at least one test table;
    measuring a volume of the droplet from a difference between the surface profile of the at least one test table and the surface profile of the droplet disposed on the at least one test table; and
    discharging the droplet to a substrate in accordance with the measured volume of the droplet.

12. The method of claim 11, wherein
    the at least one test table comprises a first test table and a second test table, and
    a surface profile of a droplet disposed on the second test table is measured when measuring a surface profile of the first test table.

13. The method of claim 11, wherein
    the at least one test table comprises a first test table and a second test table, and
    a surface profile of the first test table and a surface profile of the second test table are simultaneously measured.

14. The method of claim 11, wherein the measuring of the surface profile comprises:
    measuring a surface profile of a first region of the at least one test table; and
    measuring a surface profile of a second region of the at least one test table.

15. The method of claim 11, wherein the measuring of the volume of the droplet comprises:
- measuring a surface profile of a first region of the at least one test table and a surface profile of a second region of the at least one test table; and
- measuring a size of a droplet disposed on the first region and a size of a droplet disposed on the second region.

16. The method of claim 11, wherein the disposing of the droplet on the at least one test table comprises:
- discharging the droplet to a film of the at least one test table; and
- collecting the film.

* * * * *